(12) United States Patent
Oh et al.

(10) Patent No.: US 7,840,762 B2
(45) Date of Patent: Nov. 23, 2010

(54) MULTI-PATH ACCESSIBLE SEMICONDUCTOR MEMORY DEVICE HAVING MAILBOX AREAS AND MAILBOX ACCESS CONTROL METHOD THEREOF

(75) Inventors: Chi-Sung Oh, Gunpo-si (KR); Yong-Jun Kim, Hwaseong-si (KR); Kyung-Woo Nam, Seoul (KR); Jin-Kuk Kim, Hwaseong-si (KR); Soo-Young Kim, Hwaseong-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 388 days.

(21) Appl. No.: 11/843,877

(22) Filed: Aug. 23, 2007

(65) Prior Publication Data
US 2008/0170460 A1    Jul. 17, 2008

(30) Foreign Application Priority Data
Jan. 17, 2007    (KR) ...................... 10-2007-0005158

(51) Int. Cl.
*G06F 12/00* (2006.01)

(52) U.S. Cl. ........................... 711/149; 711/5; 711/147; 365/230.03; 365/230.05

(58) Field of Classification Search ........................ None
See application file for complete search history.

(56) References Cited

U.S. PATENT DOCUMENTS

| | | | |
|---|---|---|---|
| 5,608,873 A | | 3/1997 | Feemster et al. |
| 5,909,691 A | * | 6/1999 | Schultz et al. .................. 711/4 |
| 5,930,502 A | * | 7/1999 | Picco et al. .................. 713/501 |
| 6,122,713 A | * | 9/2000 | Huang et al. ................. 711/147 |
| 6,505,268 B1 | * | 1/2003 | Schultz et al. .................. 711/4 |
| 6,711,086 B2 | | 3/2004 | Terada |
| 6,912,716 B1 | * | 6/2005 | Johanson et al. ............ 719/312 |
| 2002/0165896 A1 | * | 11/2002 | Kim ........................... 709/102 |
| 2003/0093628 A1 | | 5/2003 | Matter et al. |
| 2005/0058002 A1 | | 3/2005 | Morikawa |
| 2008/0077937 A1 | * | 3/2008 | Shin et al. ................... 719/312 |

FOREIGN PATENT DOCUMENTS

JP    05-225774    9/1993

(Continued)

*Primary Examiner*—Jack A Lane
(74) *Attorney, Agent, or Firm*—Stanzione & Kim LLP

(57) ABSTRACT

A multipath accessible semiconductor memory device having a mailbox area and a mailbox access control method thereof are provided. The semiconductor memory device includes N number of ports, at least one shared memory area allocated in a memory cell array, and N number of mailbox areas for message communication. The at least one shared memory area is operationally connected to the N number of ports, and is accessible through a plurality of data input/output lines to form a data access path between the at least one shared memory area and one port, having an access right to the at least one memory area, among the N number of ports. The N number of mailbox areas are provided in one-to-one correspondence with the N number of ports and are accessible through the plurality of data input/output lines when an address of a predetermined area of the at least one shared memory area is applied to the semiconductor memory device. An efficient layout of mailboxes and an efficient message access path can be obtained.

30 Claims, 15 Drawing Sheets

FOREIGN PATENT DOCUMENTS

| | | |
|---|---|---|
| JP | 09-044395 | 2/1997 |
| JP | 2000-188381 | 7/2000 |
| KR | 100184454 | 12/1998 |
| KR | 20020058322 | 7/2002 |
| KR | 20030069526 | 8/2003 |
| KR | 20030076052 | 9/2003 |
| KR | 20050022855 | 3/2005 |
| KR | 20050080704 | 8/2005 |

* cited by examiner

MULTI-PATH ACCESSIBLE SEMICONDUCTOR MEMORY DEVICE HAVING MAILBOX AREAS AND MAILBOX ACCESS CONTROL METHOD THEREOF

CROSS-REFERENCE TO RELATED APPLICATIONS

This application claims priority under 35 U.S.C. §119 from Korean Patent Application 10-2007-0005158, filed on Jan. 17, 2007, the contents of which are hereby incorporated by reference in their entirety for all purposes as if fully set forth herein.

BACKGROUND OF THE INVENTION

1. Field of the Invention

The present general inventive concept relates to semiconductor memory devices. More particularly, the present general inventive concept relates to a multipath accessible semiconductor memory device having mailbox areas and a mailbox access control method thereof.

2. Description of the Related Art

In general, a semiconductor memory device having a plurality of access ports is called a multiport memory, and in particular a memory device having two access ports is called a dual-port memory. A typical dual-port memory is well-known in the field, as an image processing video memory having a RAM port accessible in a random sequence and a SAM port accessible only in a serial sequence.

Alternatively, a dynamic random access memory to read from or write to a shared memory area through a plurality of access ports in a memory cell array that does not have an SAM port, but is constructed of a DRAM cell, is called herein a multipath accessible semiconductor memory device in the present general inventive concept.

In recent portable electronic systems such as a handheld multimedia player or handheld phone, or in electronic instruments such as PDA etc., manufacturers have produced products of multiprocessor systems employing plural processors as illustrated in FIG. 1 in order to get a high speed and smooth operation.

Referring to FIG. 1, a first processor 10 and a second processor 12 are connected with each other through a connection line L10. Further, a NOR memory 14 and a DRAM 16 are coupled with the first processor 10 through determined buses B1-B3. A DRAM 18 and a NAND memory 20 are coupled with the second processor 12 through determined buses B4-B6. The first processor 10 may have a MODEM function of performing a modulation and demodulation of a communication signal. The second processor 12 may have an application function of dealing with communication data or games or performing amusements, etc. A NOR memory 14 having a NOR structure of a cell array, and a NAND memory 20 having a NAND structure of a cell array, are both nonvolatile memories having a transistor memory cell that has a floating gate. Such NOR memory and NAND memory are adapted to store data that must not be removed even if power is turned off, for example, peculiar codes of handheld instruments and data to be retained. The DRAMs 16 and 18 function as main memories for a data processing of processors.

However, in a multi processor system as illustrated in FIG. 1, DRAMs respectively correspond to and are each assigned to every processor, and UART, SPI, SRAM interfaces having a relatively low speed are used herein. Thus it is difficult to ensure a satisfactory data transmission speed, causing a complication in the size and increasing expenses for the configuration of memories. For that, a scheme illustrated in FIG. 2 is provided in order to reduce the size and to increase a data transmission speed and reduce the number of DRAMs.

In FIG. 2 one DRAM 17 is coupled with first and second processors 10 and 12 through buses B1 and B2. In order that each processor 10, 12 accesses one DRAM 17 through two paths in the multi processor system as illustrated in FIG. 2, it is required to connect two ports to corresponding buses B1 and B2. However, a typical DRAM has a single port.

It is therefore difficult to apply the multiprocessor system of FIG. 2 to a typical DRAM because of the structure of memory banks or ports.

Prior art having a configuration of FIG. 3, in which a shared memory area can be accessed by a plurality of processors, is disclosed in US Publication No. US2003/0093628 invented by Matter et. al. and published on May 15, 2003.

Referring to FIG. 3 illustrating a multiprocessor system 50, a memory array 35 is comprised of first, second and third portions. Further, the first portion 33 of the memory array 35 is accessed only by a first processor 70 through a port 37. The second portion 31 is accessed only by a second processor 80 through a port 38. The third portion 32 is accessed by all of the first and second processors 70 and 80. The size of the first and second portions 33 and 31 of the memory array 35 may be flexibly changed depending upon an operating load of the first and second processors 70 and 80. The type of the memory array 35 may be realized in a memory type or disk storage type.

To realize the third portion 32 shared by the first and second processors 70 and 80 within the memory array 35 in a structure of DRAM, memory areas of the memory array 35 and input/output sense amplifiers may be disposed and a read/write path for the respective ports may be appropriately controlled.

Furthermore, a UART, SPI, or SRAM interface has been used to get the communication between conventional processors, i.e., MODEM and application processor (or, multimedia coprocessor). Such interfaces cause a limitation in speed, an increase in the number of pins, etc. In particular, to obtain a smooth operation in three dimensional games or image communication, HDPDA, WIBRO etc., data traffic between MODEM and processors should be increased, thus the necessity in a high speed interface between processors tends to increase.

An adequate solution capable of sharing a shared memory area allocated in a DRAM memory cell array and simultaneously solving a problem caused by a low-speed interface outside a memory, in a multiprocessor system having two or more processors is needed. This is described with reference to FIG. 4.

FIG. 4 is a block diagram illustrating a multiprocessor system having a conventional multipath accessible semiconductor memory device (DRAM). With reference to FIG. 4, a portable communication system includes a first processor 10, a second processor 12, and a DRAM 17 that includes memory areas accessed by the first and second processors 10 and 20 within a memory cell array. The portable communication system also includes flash memories 101 (NOR) and 102 (NAND/OneNAND) connected to the first and second processors 10 and 12 through each bus.

Though not limited, the DRAM 17 illustrated in FIG. 4 may be configured to have two independent ports. If a port A having an output of signal INTa is herein called a first port and a port B having an output of signal INTb is called a second port, the first port is connected to the first processor 10 through a general-purpose input/output (GPIO) line, and the second port is connected to the second processor 12 through a general-purpose input/output (GPIO) line. The first processor 10 may have a MODEM function of performing a modulation and demodulation of a communication signal, a baseband processing function, etc. The second processor 12 may have an application function to process communication data or perform game, moving image, amusement, etc. The second processor 12 may be a multimedia coprocessor if necessary.

The flash memories 101 and 102 are nonvolatile memories constructed of one or more MOS transistors, in which the cell connected configuration of a memory cell array has a NOR or NAND structure and a memory cell has a floating gate. The flash memories 101 and 102 are adapted to store data that is not removed even if power is turned off, for example, peculiar codes of handheld instruments and data to be retained.

As illustrated in FIG. 4, the DRAM 17 having a dual port may be used to store commands and data to be executed by the processors 10 and 12. Further, the DRAM 17 is in charge of an interface function between the first and second processors 10 and 12. In a communication between the first and second processors 10 and 12, a DRAM interface is used instead of an external interface. To provide an interface between processors through DRAM, an interface unit such as a register, buffer, etc. is adapted inside the DRAM. The interface unit has a semaphore area and mailbox areas that may be a familiar concept to processing system developers. A specific row address, i.e., 1FFF800h~1FFFFFFh, 2 KB size=1 row size, of enabling an optional one row of a shared memory area in DRAM, is changeably allocated to an internal register as the interface unit. That is, when the specific row address 1FFF800h~1FFFFFFh is applied, a specific word line corresponding to the shared memory area is disabled, and the interface unit is enabled.

As a result, systematically, the semaphore area and the mailbox areas of the interface unit are accessed by using a direct address mapping method, and internally in a DRAM, a command accessed with a corresponding disabled address is decoded and the mapping is performed with the register adapted inside the DRAM. Thus, for this area, a memory controller of a chip set generates a command in the same method as a cell of other memory.

The mailbox areas are specifically adapted each per port (per processor). In a dual-port, two sorts are provided. In the mailbox areas, a mailbox A to B area is writable in a first processor 10, but only readable and a write operation is not allowed in second processor 12. To the contrary, a mailbox B to A area is writable in a second processor 12, but only readable and the write operation is not allowed in first processor 10.

The mailbox A to B may be called herein a first mailbox and the mailbox B to A may be called herein a second mailbox. The first mailbox may be provided to transmit a message through the first port, or from the first processor 10 to the second processor 12 or second port. The second mailbox may be provided to transmit a message through the second port or from the second processor 12 to the first processor 10 or first port.

A control right to shared memory area is represented in the semaphore area allocated to the register, and a message, i.e., a request for the right, data transfer, command transmission, etc., given to a counterpart processor is written to the mailbox area in a predetermined transmission direction. Particularly, in transferring a message to a counterpart processor through a mailbox area, a mailbox write command is used. When the write command is produced, the DRAM generates interrupt signals INTa and INTb as an output signal to execute an interrupt processing service of a corresponding processor in a predetermined direction, and this output signal is coupled to a GPIO of a corresponding processor, or UART, etc., in hardware. The interrupt signals INTa and INTb function as the signal of informing the counterpart processor of having written a message to the mailbox area.

As the necessity for semiconductor memory devices (DRAM) having a mailbox area for communication of a message such as an access right request, data transfer, command transmission, etc., as described above, increases, it is also required to efficiently dispose the mailboxes so as to substantially reduce the increase of chip size and to efficiently configure a message access path to provide access to the mailbox.

SUMMARY OF THE INVENTION

The present general inventive concept provides a multipath accessible semiconductor memory device having a mailbox area, and a mailbox access control method thereof, in which a message is transmitted through a shared data input/output path or through a specifically adapted common message input/output path. A chip size can be substantially reduced. Further, a number of message input/output lines performing an input/output of message with the mailbox can be substantially reduced.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a semiconductor memory device having N number of ports, the device including at least one shared memory area provided in a memory cell array, operationally connected to the N number of ports, and accessible through a plurality of data input/output lines to form a data access path between the at least one shared memory area and one port, having an access right to the at least one shared memory area, among the N number of ports; and N number of mailbox areas for message communication provided in one-to-one correspondence with the N number of ports and accessible through the plurality of data input/output lines when an address of a predetermined area of the at least one shared memory area is applied to the semiconductor memory device.

N may be two. In this case, one of two ports may be a first port and the other of them may be a second port. Each of the two mailbox areas may include at least one first mailbox that is writable and readable through the first port and that is not writable but readable through the second port, and at least one second mailbox that is writable and readable through the second port and that is not writable but readable through the first port.

The semiconductor memory device may further include a mailbox path controller to set at least one message access path to the two mailbox areas through the first and second ports. The mailbox areas may be disposed on both sides of the at least one shared memory area, and the data input/output lines may be disposed in parallel over the at least one shared memory area to form a shared path serving as a data access path or a message access path.

The at least two first mailboxes may be classified into at least one first local mailbox capable of being connected to the first port through the shared path and at least one first main mailbox capable of being directly connected to the first port without using the shared path. The at least two second mailboxes may be classified into at least one second local mailbox capable of being connected to the second port through the shared path and at least one second main mailbox capable of being directly connected to the second port without using the shared path.

When the first port has an access right to the at least one shared memory area, a message writing operation may be performed on all of the at least one first main mailbox and the at least one first local mailbox through the first port and be performed on the at least one second main mailbox through the second port, and a message reading operation may be performed on the at least one second main mailbox through the first port and be performed on the at least one first local mailbox through the second port. When the second port has an access right to the at least one shared memory area, a message writing operation may be performed on the at least one first main mailbox through the first port and be performed on the at least one second main mailbox and the at least one second local mailbox through the second port, and a message reading operation may be performed on the at least one second local mailbox through the first port and be performed on the at least one first main mailbox through the second port. During the message reading operation is performed on the at least one second main mailbox through the first port, an operation of updating messages of the at least one second local mailbox with messages of the at least one second main mailbox may be performed, and during the message reading operation is performed on the at least one first main mailbox through the second port, an operation of updating messages of the at least one first local mailbox with messages of the at least one first main mailbox may be performed.

The foregoing and/or other aspects and utilities of the present general inventive concept may be achieved by providing a semiconductor memory device having N number of ports, the device including at least one shared memory area provided in a memory cell array, operationally connected to the N number of ports, and accessible through a plurality of data input/output lines to form a data access path between the at least one shared memory area and one port, having an access right to the at least one shared memory area, among the N number of ports; and N number of mailbox areas accessible through a plurality of message input/output lines, which are provided per port for message communication between the N number of ports, are separately disposing in parallel to the plurality of data input/output lines, and serve as a message access path, when an address of a predetermined area of the at least one shared memory area is applied to the semiconductor memory device.

The plurality of message input/output lines may be disposed over the at least one shared memory area. In the semiconductor memory device, N may be two. In this case, one of two ports may be a first port and the other of them may be a second port.

Each of the mailbox areas may include at least one first mailbox that is writable and readable through the first port and that is not writable but readable through the second port, and at least one second mailbox that is writable and readable through the second port and that is not writable but readable through the first port. The number of message input/output lines may be equal to the number of mailboxes.

The first mailboxes may include at least one first local mailbox and at least one first main mailbox. The at least one first local mailbox may form a first local mailbox block which is capable of being connected to the first port through a first common message input/output line, and the at least one first main mailbox may form a first main mailbox block which is capable of being directly connected to the first port without using the first common message input/output line. The second mailboxes may include at least one second local mailbox and at least one second main mailbox. The at least one second local mailbox may form a second local mailbox block which is capable of being connected to the second port through a second common message input/output line, and the at least one second main mailbox may form a second main mailbox block which is capable of being directly connected to the second port without using the second common message input/output line.

The semiconductor memory device may further include a mailbox sub-decoder to selectively connect any one of the at least one first local mailbox of the first local mailbox block and any one of the at least one first main mailbox of the first main mailbox block through the first common message input/output line, or selectively connect any one of the at least one second local mailbox of the second local mailbox block and any one of the at least one second main mailbox of the second main mailbox block through the second common message input/output line. The at least one first main mailbox and the at least one second local mailbox may be coupled to the first port through separate lines. The at least one first local mailbox and the at least one second main mailbox may be coupled to the second port through separate lines.

Messages written to the at least one first main mailbox through the first port may be serially transmitted through the first common message input/output line and may be written to the at least one first local mailbox. Messages written to the at least one second main mailbox through the second port may be serially transmitted through the second common message input/output line and may be written to the at least one second local mailbox. A message reading operation on any one of the at least two first mailboxes through the second port may be performed by accessing to a corresponding first local mailbox. A message reading operation on any one of the at least two second mailboxes through the first port may be performed by accessing to a corresponding second local mailbox.

The semiconductor memory device may include a plurality of the first local mailbox blocks, the first main mailbox blocks, the second local mailbox blocks and the second main mailbox blocks, and may further include a mailbox main decoder to select any one of the first mailbox blocks and any one of the second mailbox blocks so that a mailbox area is accessed through the first or second port.

The foregoing and/or other aspects and utilities of the present general inventive concept may be achieved by providing a method of controlling an access to a mailbox in a semiconductor memory device having a shared memory area accessed through at least two ports and a mailbox area accessed when an address of a predetermined area of the shared memory area is applied to the semiconductor memory device, and adapted to perform a message communication between the at least two ports, including preparing pairs of main and local mailbox blocks as many as the number of ports, each pair of main and local mailbox blocks corresponding to one of the at least two ports, each local mailbox block including a plurality of local mailboxes that each are capable of being connected to a corresponding port through a data access path serving as a shared path for the shared memory area, and each main mailbox block including a plurality of main mailboxes that each are capable of being directly connected to a corresponding port without using the shared path; and performing a control so that when a predetermined port of the at least two ports has an access right to the shared memory area, a message writing operation on all of main mailboxes and local mailboxes corresponding to the predetermined port and a message reading operation on some main mailboxes, having messages to the predetermined port, among the main mailboxes corresponding to the other ports are performed through the predetermined port, and so that when the predetermined port does not have the access right to the shared memory area, a message writing operation on the main mailboxes corresponding to the predetermined port and a message reading operation on some local mailboxes, having messages to the predetermined port, among the local mailboxes corresponding to the other ports are performed through the predetermined port.

While the message read operation on the some main mailboxes is being performed through the predetermined port, an update operation may be performed so that messages in the some main mailboxes are the same as messages of corresponding local mailboxes.

The foregoing and/or other aspects and utilities of the present general inventive concept may be achieved by providing a method of controlling an access to a mailbox in a semiconductor memory device having a shared memory area accessed through at least two ports and a mailbox area accessed when an address of a predetermined area of the shared memory area is applied to the semiconductor memory device, and adapted to perform a message communication between the at least two ports, the method including preparing pair of main and local mailbox blocks as many as the number of ports, each pair of main and local mailbox blocks corresponding to one of the at least two ports, each local mailbox block including a plurality of local mailboxes that are accessible through a common message input/output line separate from data input/output lines for a data access to the shared memory area, and each main mailbox block including a plurality of main mailboxes that are accessible through a corresponding port without using the common message input/output line; and performing a control so that a message writing operation through a predetermined port of the at least two ports is performed on only at least one mailbox corresponding to the predetermined port and the written messages are serially transmitted through the common message input/output line and written to the at least one local mailbox corresponding to the predetermined port, and a message reading operation through the predetermined port is performed on some local mailboxes, having message to the predetermined port, among the local mailboxes corresponding to the other ports.

The foregoing and/or other aspects and utilities of the general inventive concept may also be achieved by providing a semiconductor memory device including a first local mailbox block having a plurality of local mailboxes, a first main mailbox block having a plurality of first main mailboxes, a first common message input/output line interposed between the first local mailbox block and the first main mailbox block and a mailbox sub decoder to selectively couple any one of the plurality of first local mailboxes and any one of the plurality of first main mailboxes to the first common message input/output line.

The foregoing and/or other aspects and utilities of the general inventive concept may also be achieved by providing a computer-readable recording medium having embodied thereon a computer program to execute a method of controlling an access to a plurality of mailboxes in a semiconductor memory device having a shared memory area accessed through a plurality of ports and a mailbox area accessed when an address of a predetermined area of the shared memory area is applied to the semiconductor memory device, and adapted to perform a message communication between the plurality of ports, wherein the method comprises: preparing pairs of main and local mailbox blocks as many as the number of ports, each pair of main and local mailbox blocks corresponding to one of the plurality of ports, each local mailbox block including a plurality of local mailboxes that each are capable of being connected to a corresponding port through a data access path serving as a shared path for the shared memory area, and each main mailbox block including a plurality of main mailboxes that each are capable of being directly connected to a corresponding port without using the shared path; and performing a control so that when a predetermined port of the plurality of ports has an access right to the shared memory area, a message writing operation on all of main mailboxes and local mailboxes corresponding to the predetermined port and a message reading operation on some main mailboxes, having message to the predetermined port, among main mailboxes corresponding to the other ports are performed through the predetermined port, and so that when the predetermined port does not have the access right to the shared memory area, a message write operation on the main mailbox corresponding to the predetermined port and a message read operation on some local mailboxes, having messages to the predetermined port, among the local mailboxes corresponding to the other ports are performed through the predetermined port.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
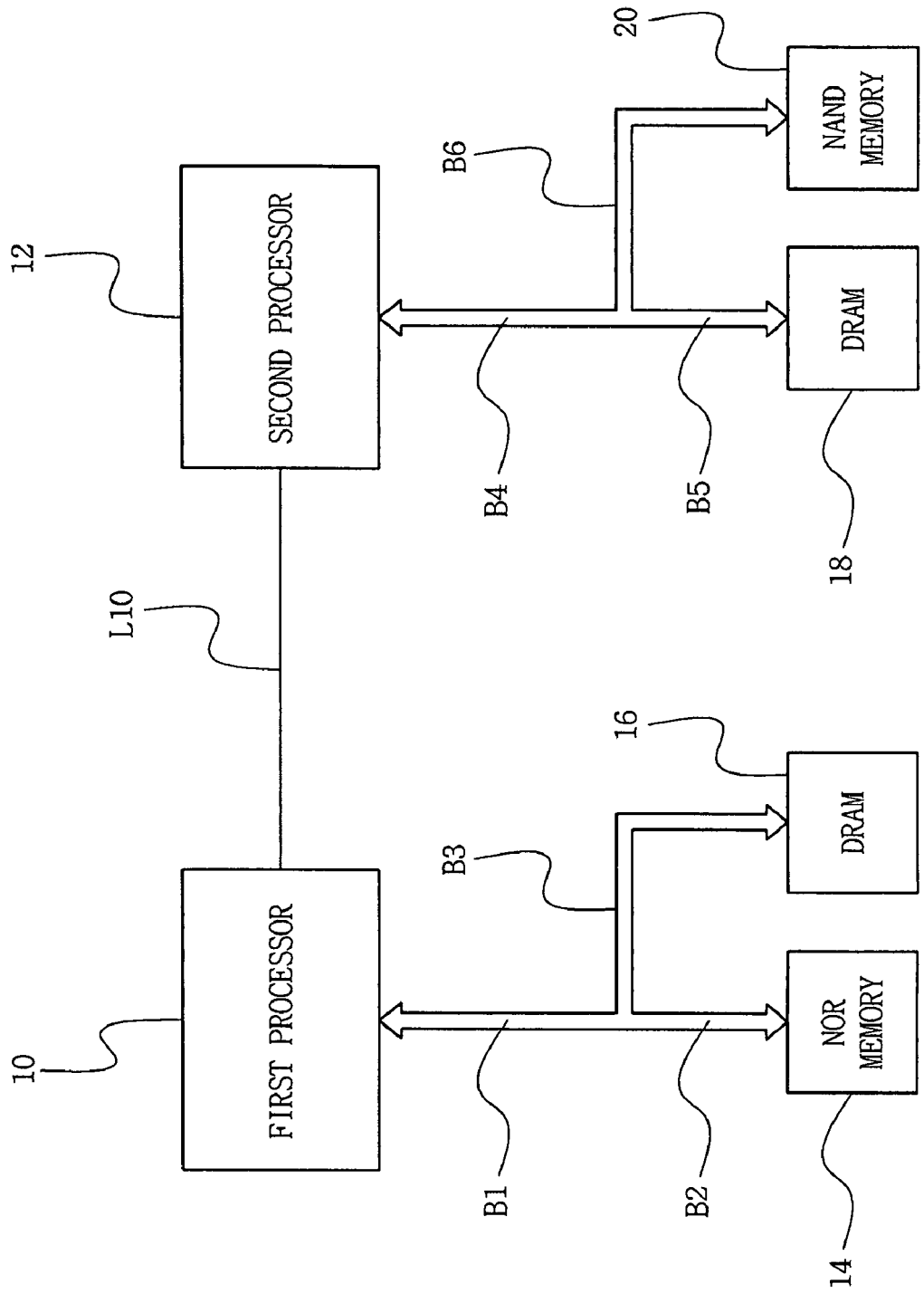
FIG. 1 is a block diagram illustrating a multiprocessor system employed in a portable communication device according to a conventional art.
Figure 2:
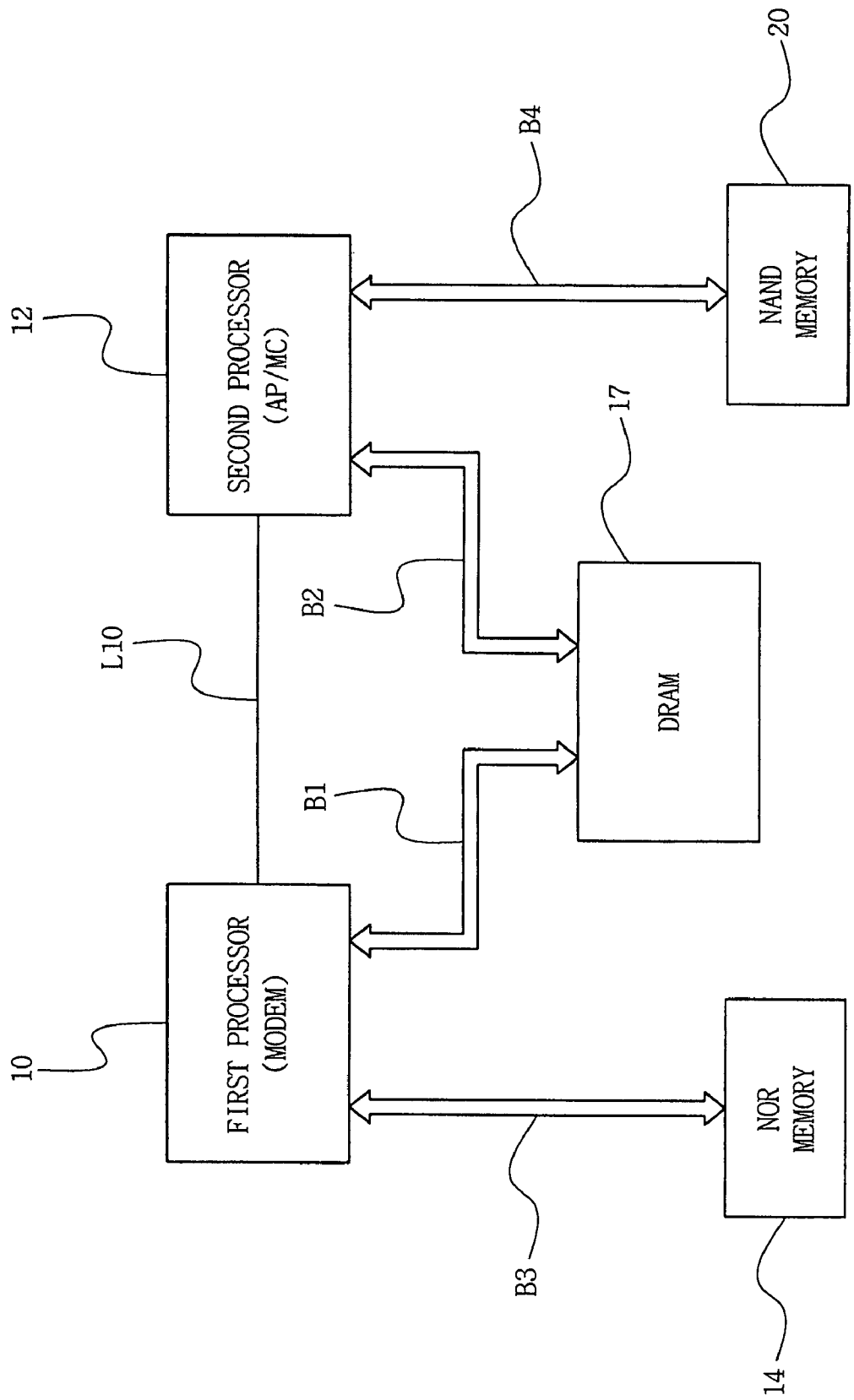
FIG. 2 is a block diagram illustrating a multiprocessor system employing a memory.
Figure 3:
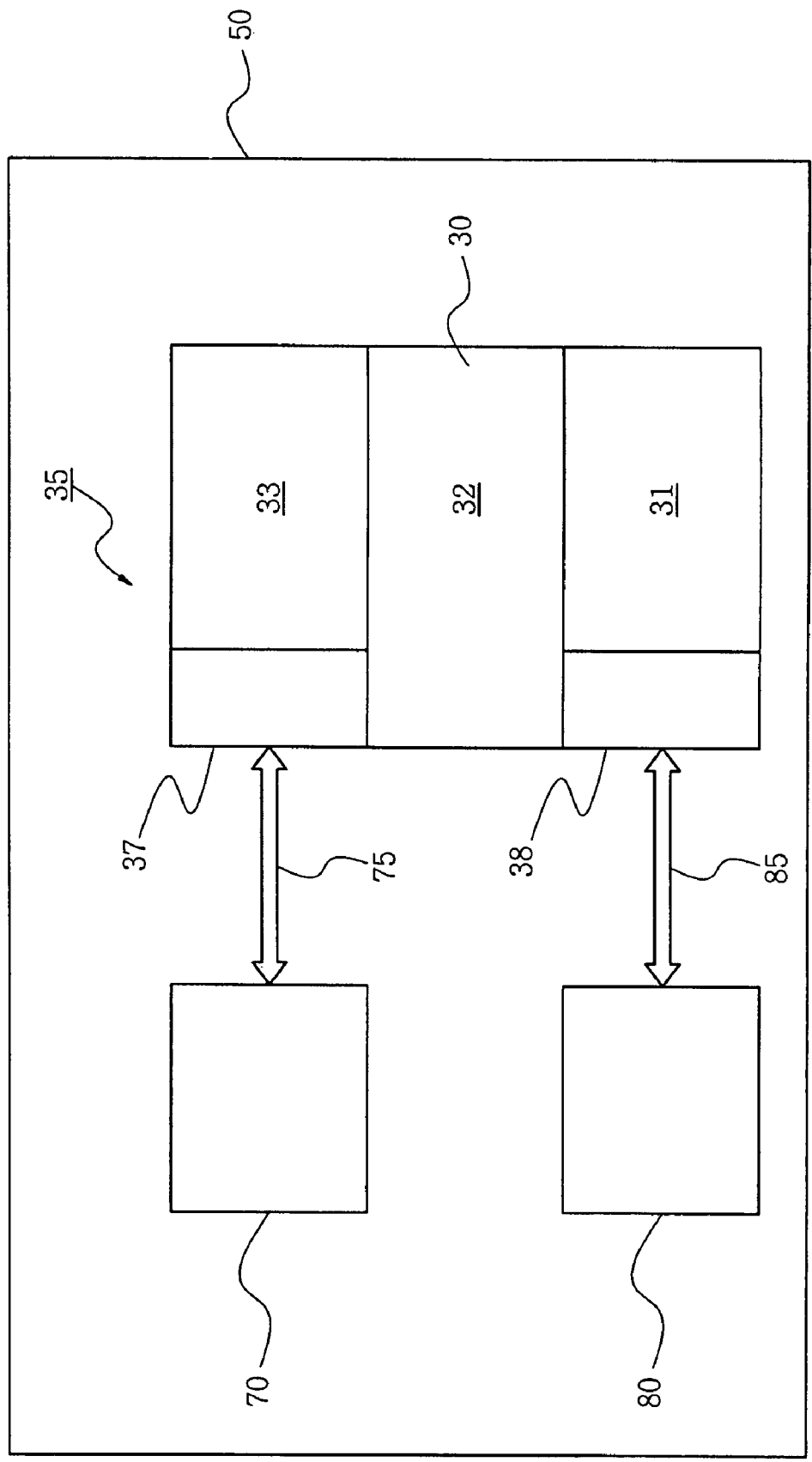
FIG. 3 is a block diagram illustrating a memory array portion of a multiprocessor system according to a conventional art.
Figure 4:
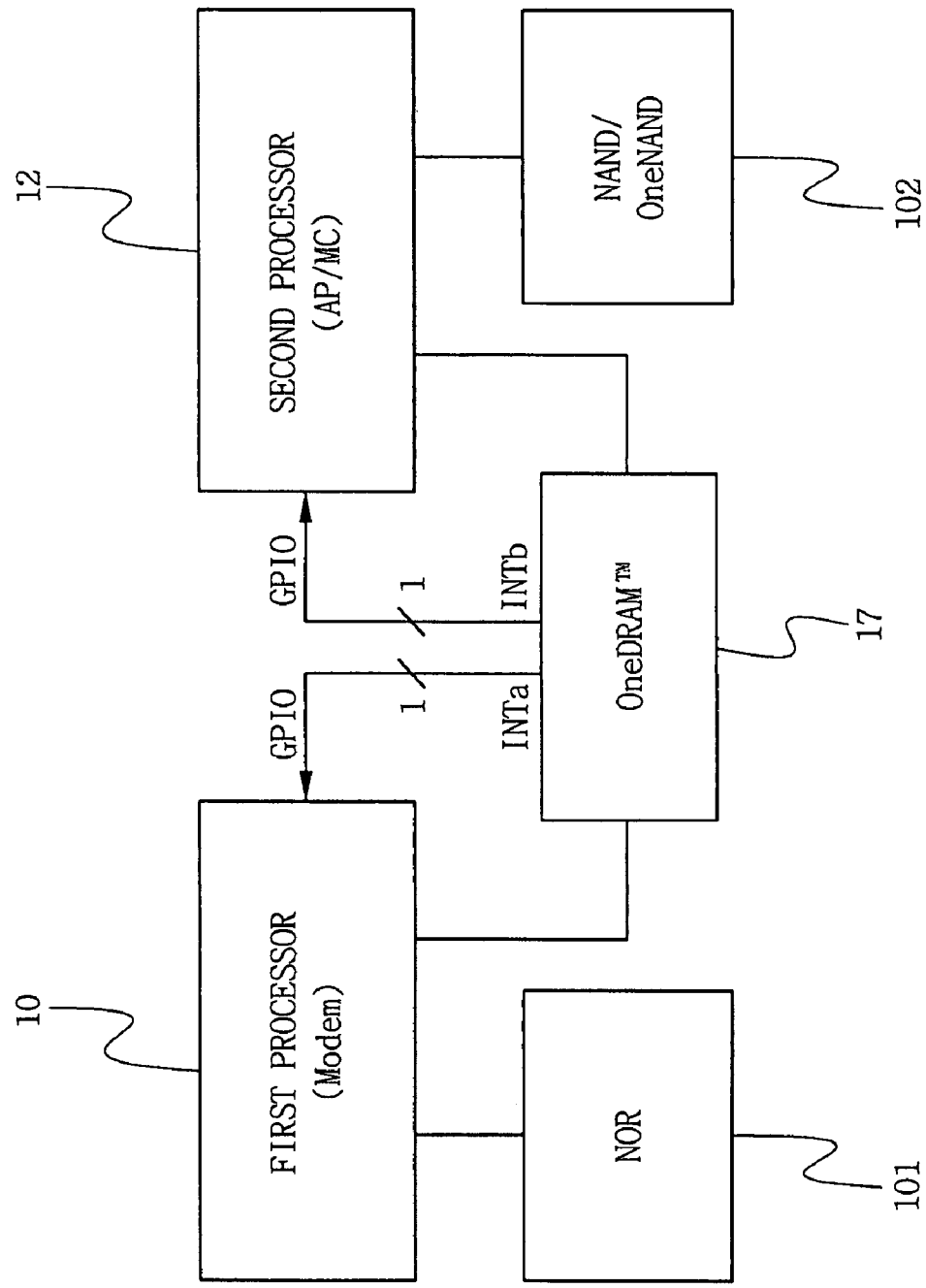
FIG. 4 is a block diagram illustrating a multiprocessor system having a multipath accessible DRAM according to various embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Unless otherwise defined, all terms (including technical and scientific terms) used herein have the same meaning as commonly understood by one of ordinary skill in the art to which this present general inventive concept belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present general inventive concept are more fully described below with reference to FIGS. 4 to 15. This present general inventive concept may, however, be embodied in many different forms and should not be construed as being limited to the exemplary embodiments set forth herein; rather, these exemplary embodiments are provided so that this disclosure is thorough and complete, and conveys the concept of the present general inventive concept to those skilled in the art.

Other examples, publishing methods, general dynamic random access memory and circuits will not be described in detail in the following description, so as not to make the present general inventive concept obscure.

Figure 5:
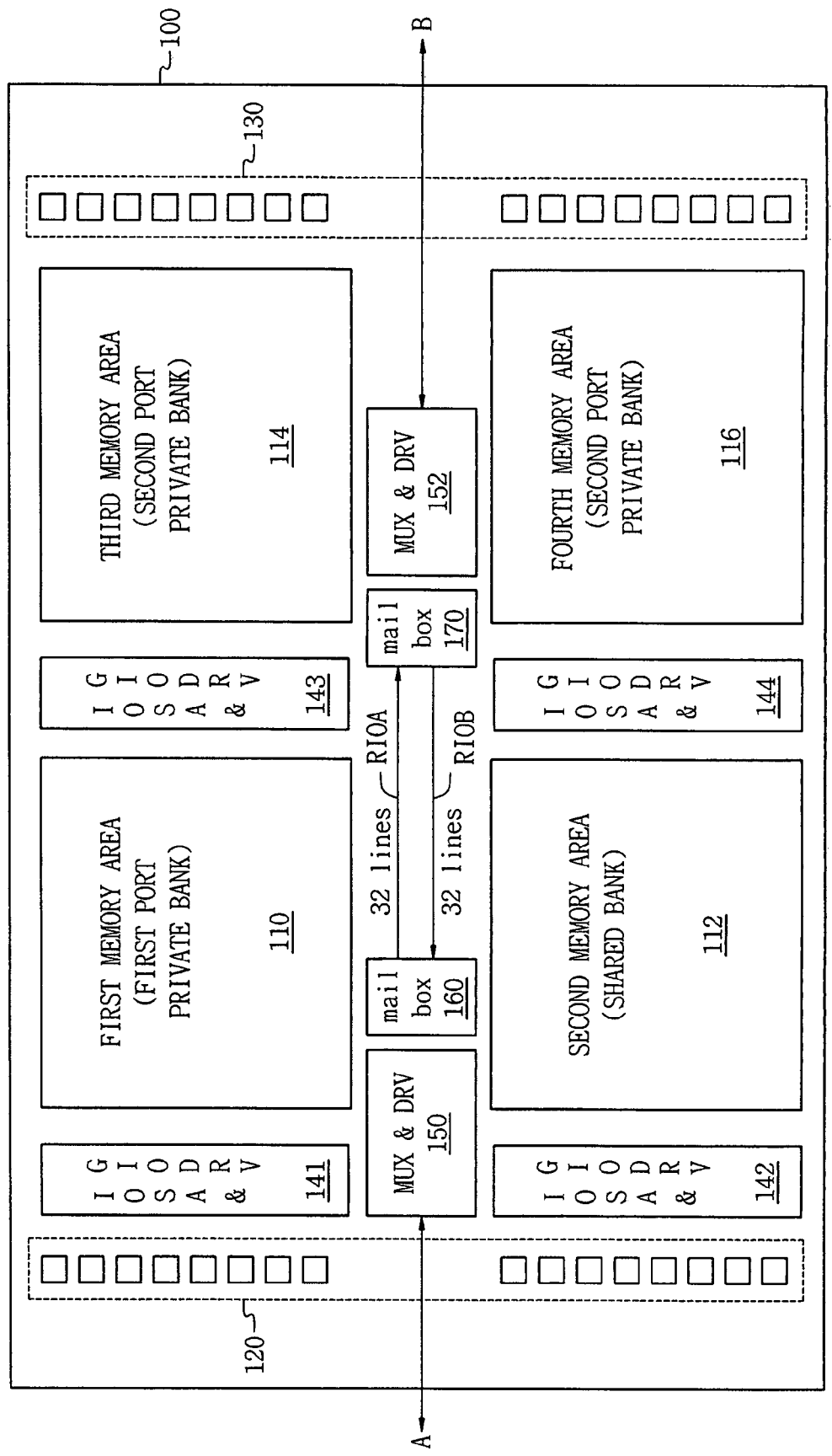
FIG. 5 illustrates a layout correlation between memory areas and a mailbox area of a semiconductor memory device according to an embodiment of the present general inventive concept.

FIG. 5 illustrates a layout of memory areas and a mailbox area in a semiconductor memory device according to an embodiment of the present general inventive concept. The semiconductor memory device according to an embodiment of the present general inventive concept is provided as an example for a dual port memory device having first and second ports among multi port accessible semiconductor memory devices.

As illustrated in FIG. 5, four memory areas 110, 112, 114 and 116 are disposed in a memory cell array. A first memory area 110 is a private memory area accessed through a first port 120, and a second memory area 112 is a shared memory area accessed through the first and second port 120 and 130, and third and fourth memory areas 114 and 116 are private memory areas accessed through the second port 130.

In a system having a structure that the first port 120 is coupled to a first processor and the second port 130 is coupled to a second processor, the first memory area 110 is a private memory area accessed only by the first processor, and the second memory area 112 is a shared memory area accessed individually by the first and second processors, and the third and fourth memory areas 114 and 116 are private memory areas accessed only by the second processor.

Four memory areas 110, 112, 114 and 116 may each comprise a unit of a bank of DRAM, and one bank may have a storage capacity of, i.e., 64 Mbit, 128 Mbit, 256 Mbit, 512 Mbit, or 1024 Mbit.

A mailbox area 160 and 170 to provide a message communication between the first and second processors may be disposed in a peripheral region of the semiconductor memory device. As illustrated in FIG. 5, the mailbox area 160 and 170 may be disposed adjacent to a respective data multiplexer 150 and 152. The data multiplexers 150 and 152 may be operationally connected with data input/output sense amplifiers 141, 142, 143 and 144. The mailbox areas 160 and 170 perform a message transmission through an access path using message input/output buses (lines) adapted specifically. If the mailbox areas 160 and 170 each have 32 mailboxes, registers of 32 bits, 32 message input/output lines may be disposed for each mailbox area.

A mailbox layout structure illustrated in FIG. 5 requires a layout of specific message input/output lines. Thus, a specific private region is needed in the peripheral region, and when a capacity of the mailbox becomes large, many message input/output lines are required, thus increasing a chip size.

Figure 6:
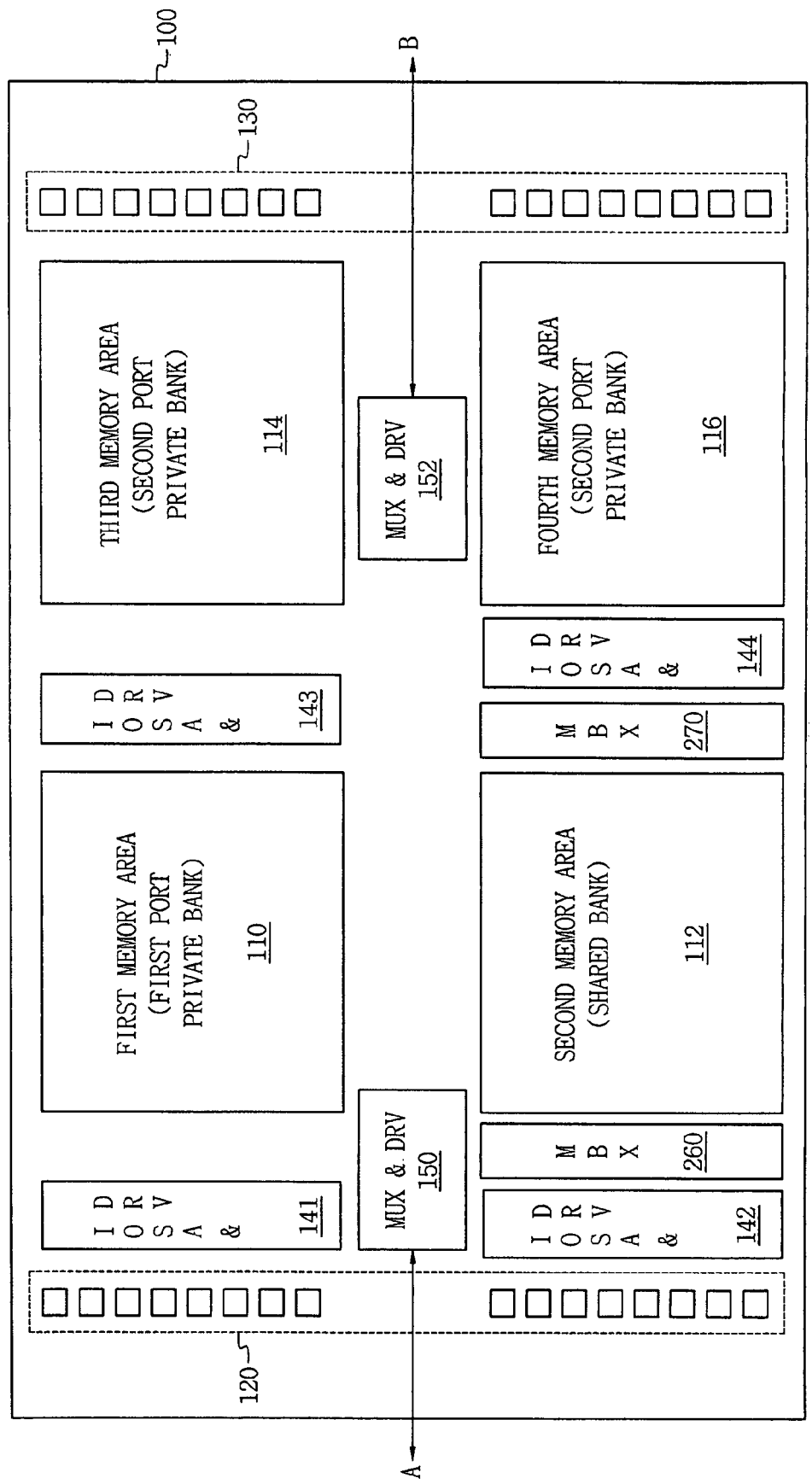
FIG. 6 illustrates a layout correlation between memory areas and a mailbox area of a semiconductor memory device according to another embodiment of the present general inventive concept.

FIG. 6 illustrates a layout of memory areas and a mailbox area in a semiconductor memory device according to another embodiment of the present general inventive concept.

FIG. 6 illustrates the mailbox areas 260 and 270 disposed at both sides of the second memory area 112 as the shared memory area, unlike in FIG. 5. For example, the mailbox areas 260 and 270 may be disposed between input/output sense amplifiers 142 and 144, which are disposed at both sides of the second memory area 112. Accordingly, a message transmission of the mailbox areas may be performed by sharing data input/output lines for a data input/output of the second memory area 112 or through a specifically adapted input/output line, which, when specifically adapted, may be called herein a message input/output line RIOA and RIOB. The message input/output line RIOA and RIOB may be disposed in a conductive layer provided in an upper portion of the second memory area 112. The message input/output line RIOA and RIOB may be disposed in parallel with and adjacent to the data input/output lines.

Various examples of a message access path in a semiconductor memory device having a mailbox layout structure as illustrated in FIG. 6 are described as follows.

First, a data access operation of the first and second ports 120 and 130 to the shared memory area 112 is described as follows, referring to FIG. 7.

Figure 7:
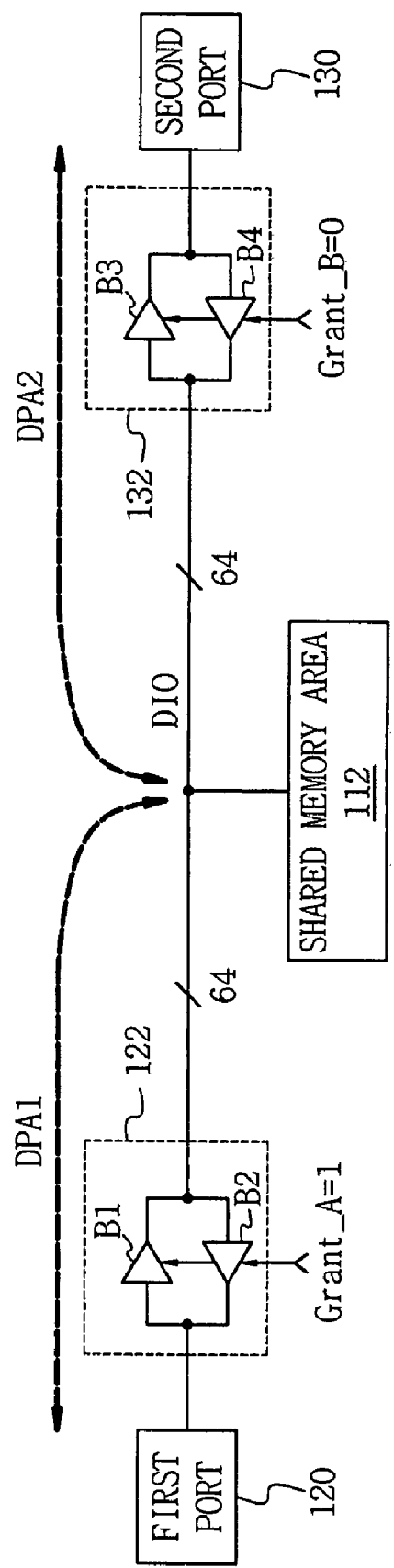
FIG. 7 illustrates a data access path per port to a shared memory area of FIG. 6.

As illustrated in FIG. 7, when the first port 120 has an access right Grant to the shared memory area 112 (Grant_A), a first port access right controller 122 is turned on and the second port access right controller 132 is turned off, thus producing a data access path DPA1 to the shared memory area 112 through the first port 120. The data access path DPA1 may be formed of a plurality of data input/output lines DIO, for example, 32 or 64 lines. Then a data read or write operation for the shared memory area 112 is implemented through the first port 120. The first port access right controller 122 and the second port access right controller 132 may include drivers B1, B2, B3 and B4 turned on/off in response to an access right signal Grant_A and Grant_B.

Subsequently, when the second port 130 has an access right Grant to the shared memory area 112 (Grant_B), the first port access right controller 122 is turned off and the second port access right controller 132 is turned on, thus producing a data access path DPA2 to the shared memory area 112 through the second port 130. Then a data read or write operation for the shared memory area 112 is implemented through the second port 130. The data access path DPA is generally formed through a data input/output line.

Figure 8:
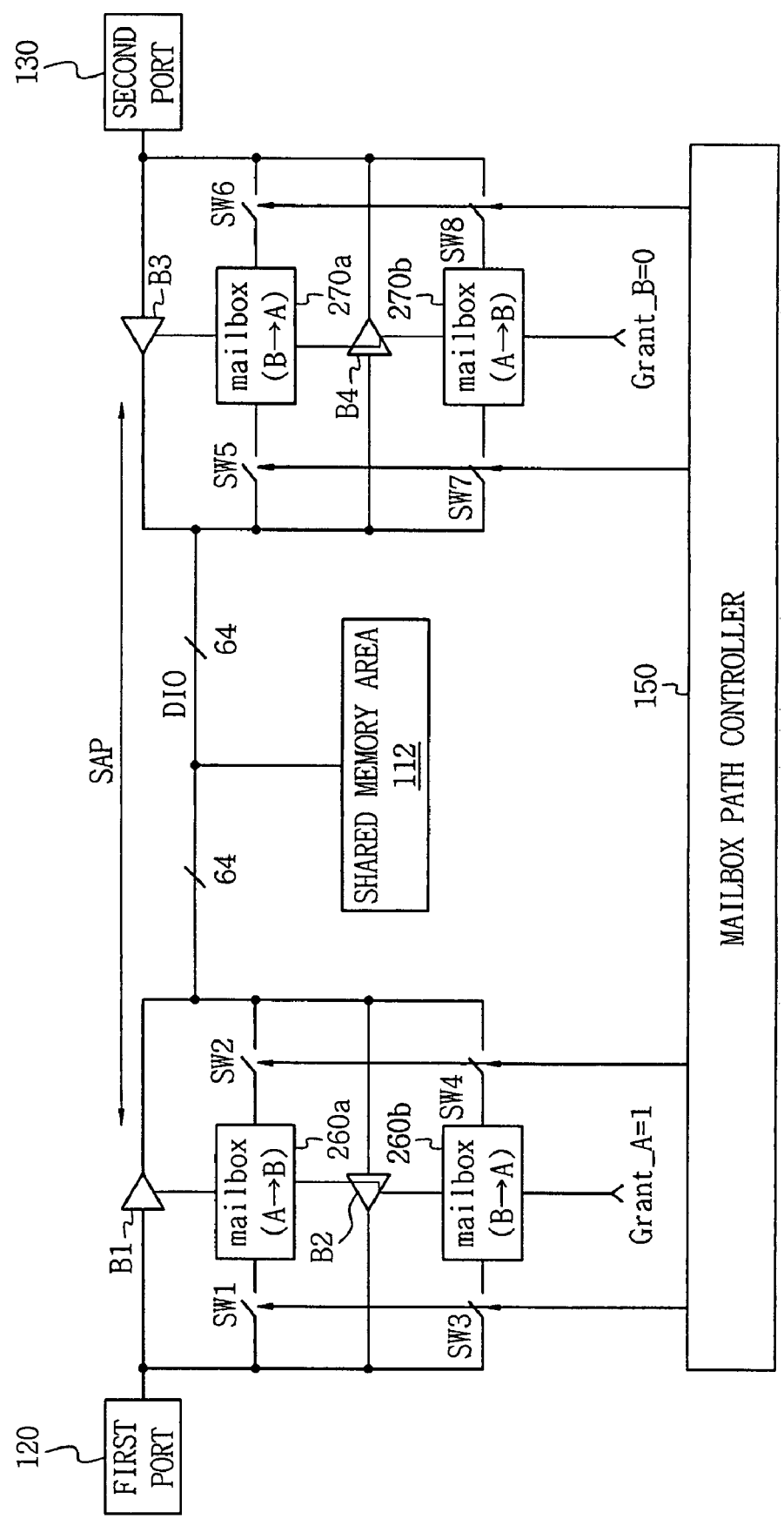
FIG. 8 illustrates a configuration of a mailbox provided when a message access path in FIG. 6 is used as a data access path.

FIG. 8 illustrates a configuration of a mailbox provided in using a message access path to provide access to the mailbox of FIG. 6, as a data access path, that is, when the data access path is shared, and FIGS. 9 to 12 offer operation thereof. In FIGS. 8 to 12, the data access path is used as a shared path to provide data access to a shared memory area and a message access to the mailbox, and thus is called herein a shared path SAP.

As illustrated in FIG. 8 there are illustrated first mailboxes 260a and 270b, second mailboxes 270a and 260b, data input/output lines DIO, a shared memory area 112 and a mailbox path controller 150.

In an embodiment of the present general inventive concept, the first mailboxes 260a and 270b may comprise registers writable through the first port 120 and only readable through the second port 130, and the second mailboxes 270a and 260b may comprise registers writable through the second port 130 and only readable through the first port 120. In another embodiment, the first mailboxes 260a and 270b may be readable through the first port 120 and the second mailboxes 270a and 260b may be readable through the second port 130.

In FIG. 8, two mailboxes per bit may be adapted per port so as to share the data access path, unlike the conventional art.

For example, the first mailboxes 260a and 270b corresponding to one bit include a first local mailbox 270b accessible passing through the shared path SAP in the first port 120, and a first main mailbox 260a accessible without passing through the shared path SAP in the first port 120. The second mailboxes 270a and 260b corresponding to one bit include a second local mailbox 260b accessible passing through the shared path SAP in the second port 130, and a second main mailbox 270a accessible without passing through the shared path SAP in the second port 130.

The first main mailbox 260a may be coupled with the first port 120 and the shared path SAP through switches SW1 and SW2. The second local mailbox 260b may be coupled with the first port 120 and the shared path SAP through switches SW3 and SW4. The second main mailbox 270a may be coupled with the second port 130 and the shared path SAP through SW5 and SW6. The first local mailbox 270b may be coupled with the second port 130 and the shared path SAP through switches SW7 and SW8.

A plurality of data input/output lines DIO are provided herein, and may be employed as 32 lines or 64 lines, etc., according to a type of semiconductor memory devices. The data input/output lines DIO form the shared path SAP.

The shared memory area 112 is accessible through the first port 120 or the second port 130 according to which port has an access right Grant.

The mailbox path controller 150 controls a message access path to the mailbox area through the first port 120 and the second port 130. For example, the message access path is controlled through a switching operation of the switches SW1~SW8.

In the drawing, drivers B1, B2, B3 and B4 constitute the access right controller 122 and 132 for the shared memory area 112 described with reference to FIG. 7.

Figure 9:
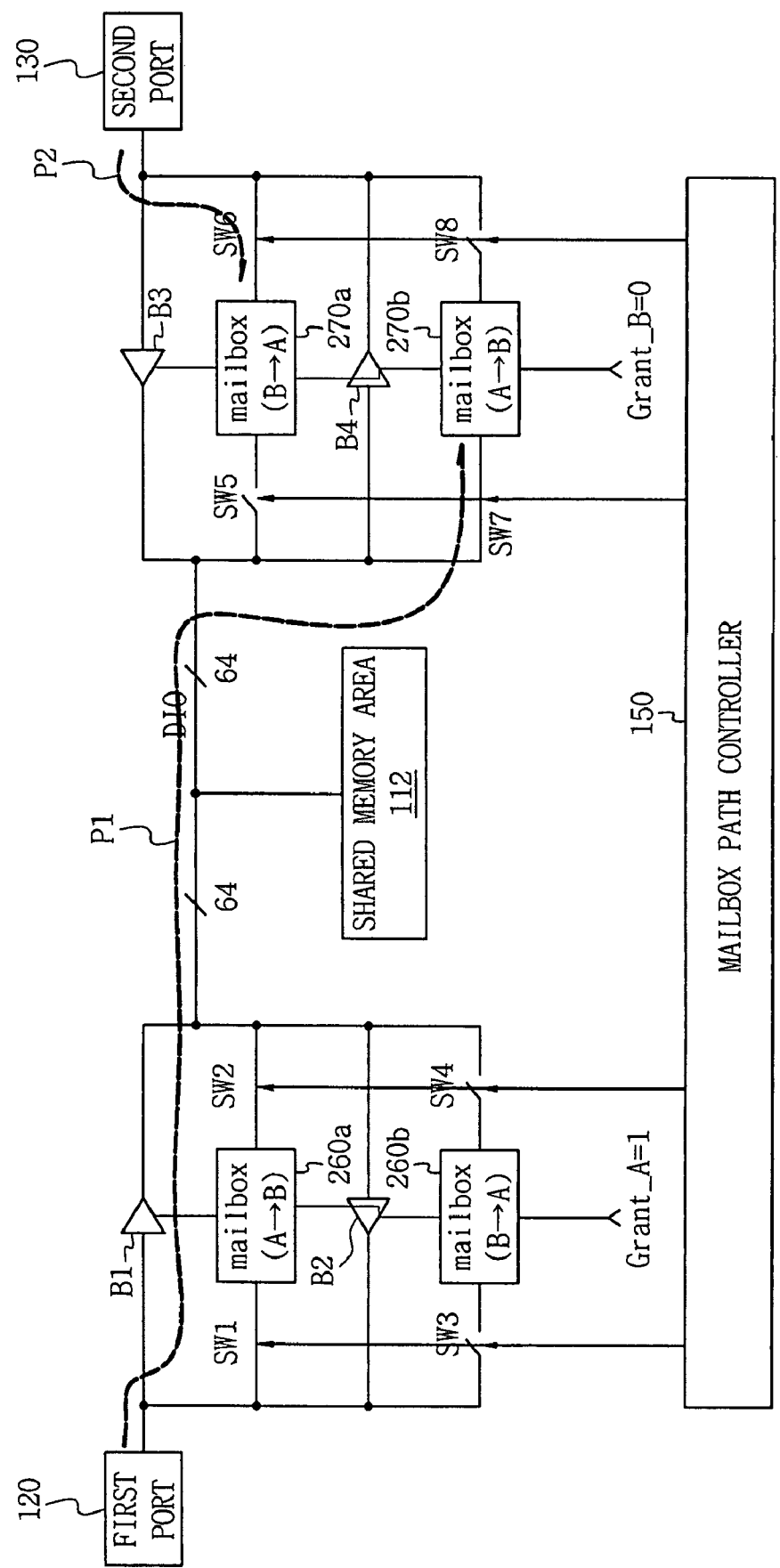
FIGS. 9 to 12 are examples of an operation of FIG. 8.
Figure 10:
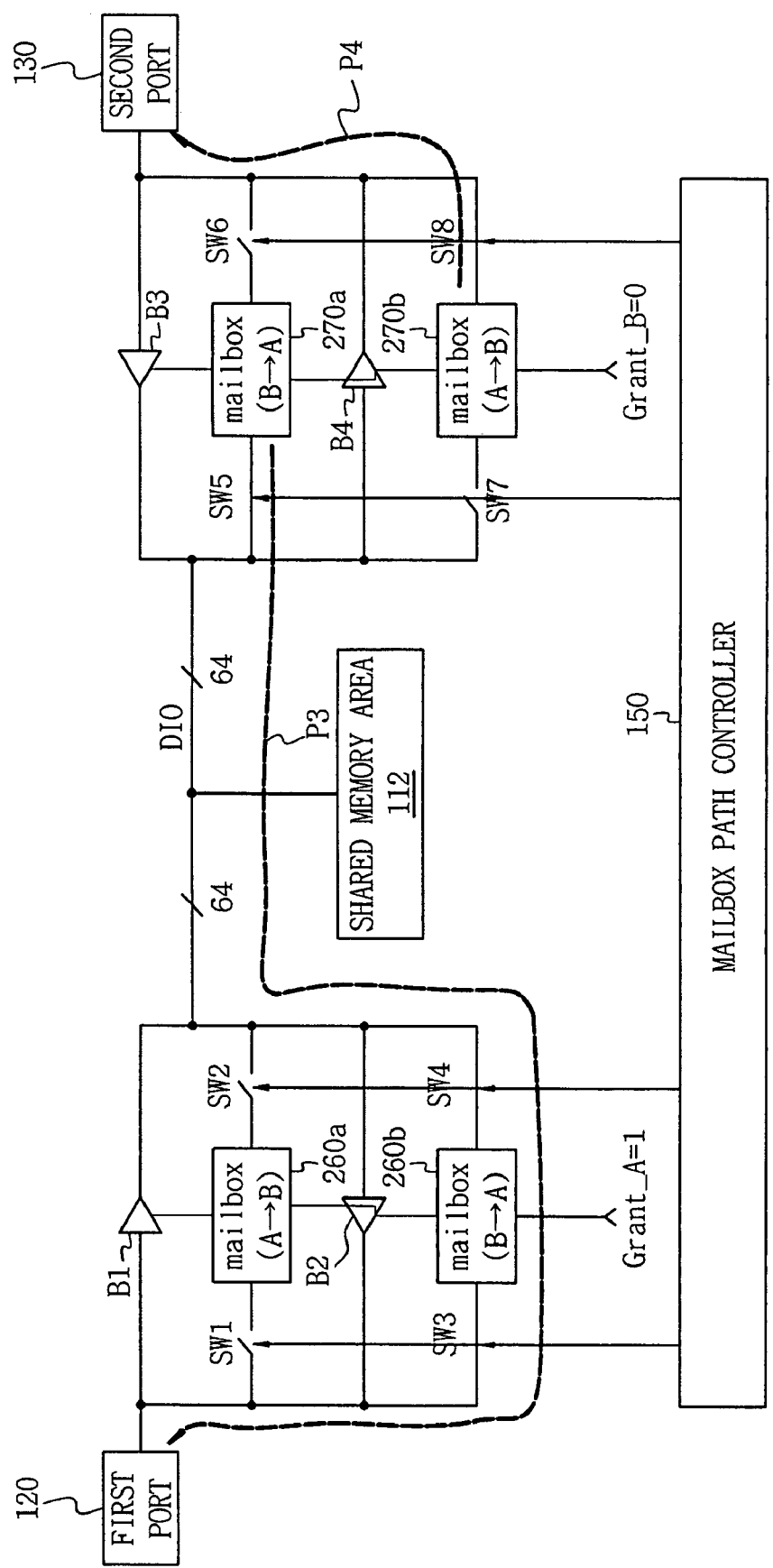

FIGS. 9 and 10 illustrate a message access operation provided when the first port 120 has an access right to the shared memory area 112. FIG. 9 provides a write operation example, and FIG. 10 provides a read operation example.

As illustrated in FIG. 9, when the first port 120 has an access right Grant_A to the shared memory area 112, the shared path SAP can be controlled by the first port 120.

Accordingly, an access path P1 is formed so that a message write through the first port 120 becomes valid for all the first main mailbox 260a and the first local mailbox 270b, which is why the first port 120 has a use right to the shared path SAP. In addition, an access path P2 is formed so that a message write operation through the second port 130 becomes valid only for the second main mailbox 270a, which is why the second port 130 does not have a use right to the shared path SAP, and so the write operation to the second local mailbox 260b is unavailable. An access path control of the write operation to the mailboxes 260a, 260b, 270a and 270b may be performed through the mailbox path controller 150.

As illustrated in FIG. 10, when the first port 120 has an access right Grant_A to the shared memory area 112, the shared path SAP can be also controlled through the first port 120.

In read operation, a message read operation for the second main mailbox 270a may be primarily implemented through the first port 120. This is why a message stored in the second main mailbox 270a is decided as the latest message. When the message stored in the second main mailbox 270a is not the latest message, another mailbox where the latest message is stored may be first accessed. Even when the second port 130 does not have an access right to the shared memory area 112, a message write to the second main mailbox 270a is valid, and thus the message of the second main mailbox 270a may be regarded as the latest message rather than a message stored in the second local mailbox 260b.

In performing a message read from the second main mailbox 270a, an update operation of making a message of the second local mailbox 260b equal to a message of the second main mailbox 270a may be executed. An access path P3 through the first port 120 may thus be controlled to connect the second main mailbox 270a to the second local mailbox 260b through the shared path SAP.

Subsequently, an access path P4 is controlled through the second port 130 so that only a read operation for the first local mailbox 270b becomes valid. Since the second port 130 does not have use right to the shared path DIO, a message read from the first main mailbox 260a is unavailable. A path control for a read operation may be performed through the mailbox path controller 150.

Figure 11:
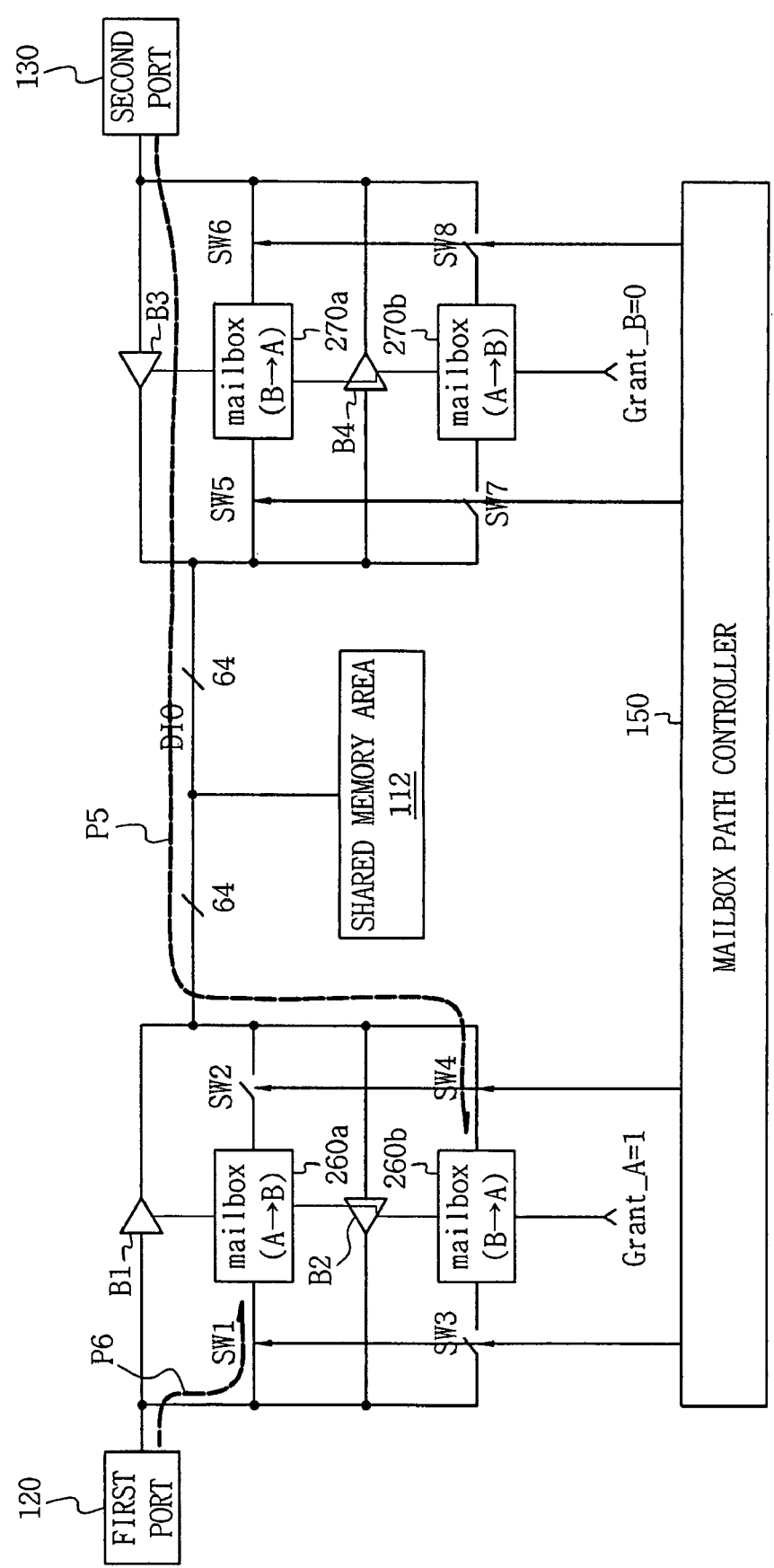
Figure 12:
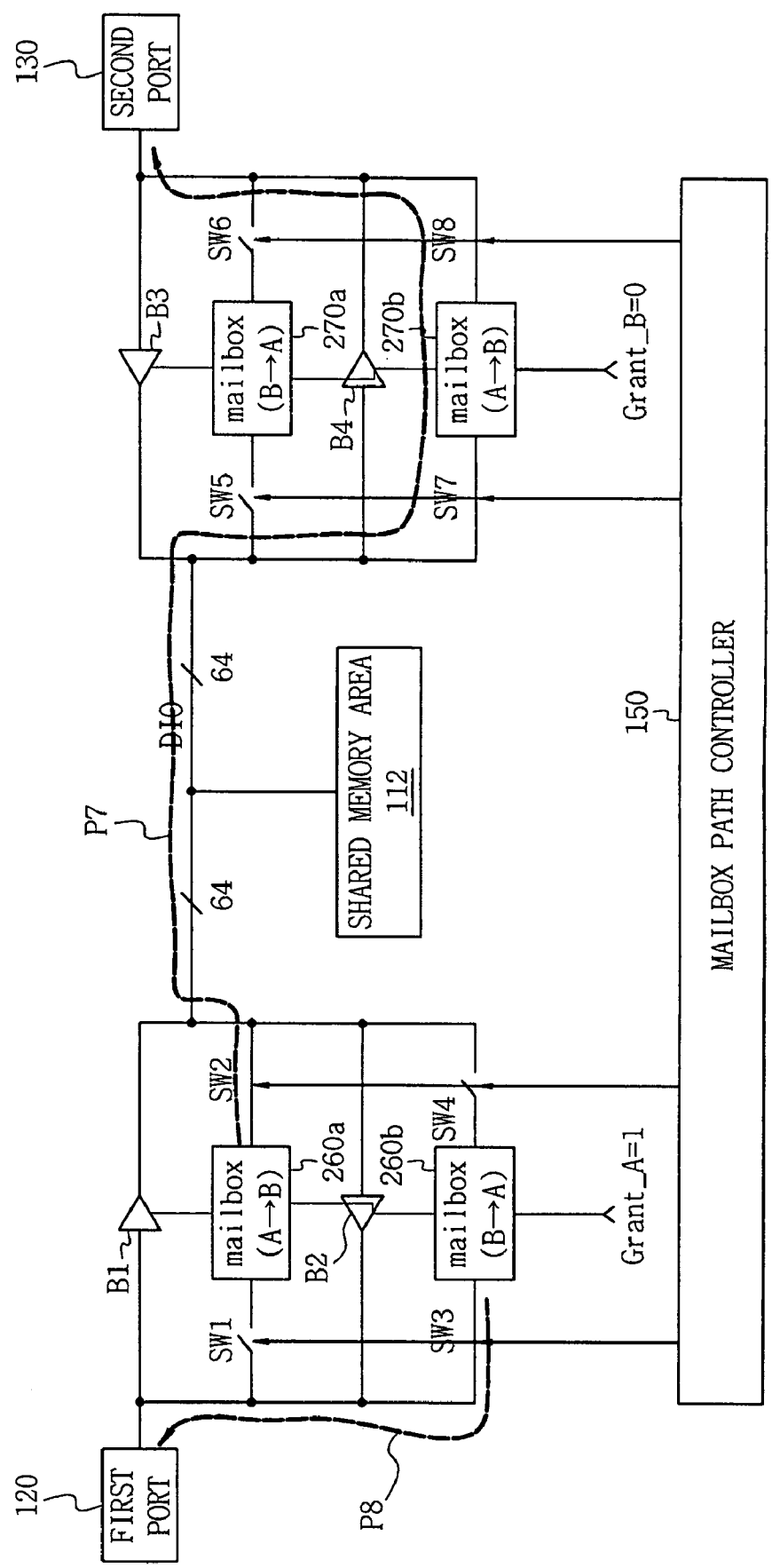

FIGS. 11 and 12 provide examples of a message access operation when the second port 130 has an access right Grant_B to the shared memory area 112. FIG. 11 illustrates a write operation example, and FIG. 12 illustrates a read operation example.

As illustrated in FIG. 11, when the second port 130 has access right Grant_B to the shared memory area 112, the shared path DIO can be also controlled through the second port 130.

Accordingly, an access path P5 is controlled so that a message write through the second port 130 becomes valid for all of the second main mailbox 270a and the second local mailbox 260b, which is why the second port 130 has a use right to the shared path DIO. An access path P6 is controlled so that a message write through the first port 120 becomes valid only for the first main mailbox 260a, which is why the first port 120 does not have a use right to the shared path DIO, and so the write operation to the first local mailbox 270b is unavailable. An access path control in the write operation may be performed through the mailbox path controller 150.

As illustrated in FIG. 12, when the second port 130 has an access right Grant_B to the shared memory area 112, the shared path DIO can be also controlled through the second port 130.

In a read operation, a message read for the first main mailbox 260a may be primarily implemented through the second port 130. This is why a message stored in the first main mailbox 260a is decided as the latest message. Even when the first port 120 does not have an access right to the shared memory area 112, a message write to the first main mailbox 260a is valid and thus the message of the first main mailbox 260a may be regarded as the latest message rather than message stored in the first local mailbox 270b.

In performing a message read for the first main mailbox 260a, an update operation of making a message of the first local mailbox 270b equal to a message of the first main mailbox 260a may be executed. An access path P7 through the second port 130 can thus be controlled to connect the first main mailbox 260a to the first local mailbox 270b through the shared path SAP.

Subsequently, an access path P8 is controlled through the first port 120 so that only a read from the second local mailbox 260b becomes valid. Since the first port 120 has no use right to the shared path DIO, a message read operation for the second main mailbox 270a is unavailable. A path control for a read operation may be performed through the mailbox path controller 150.

Figure 13:
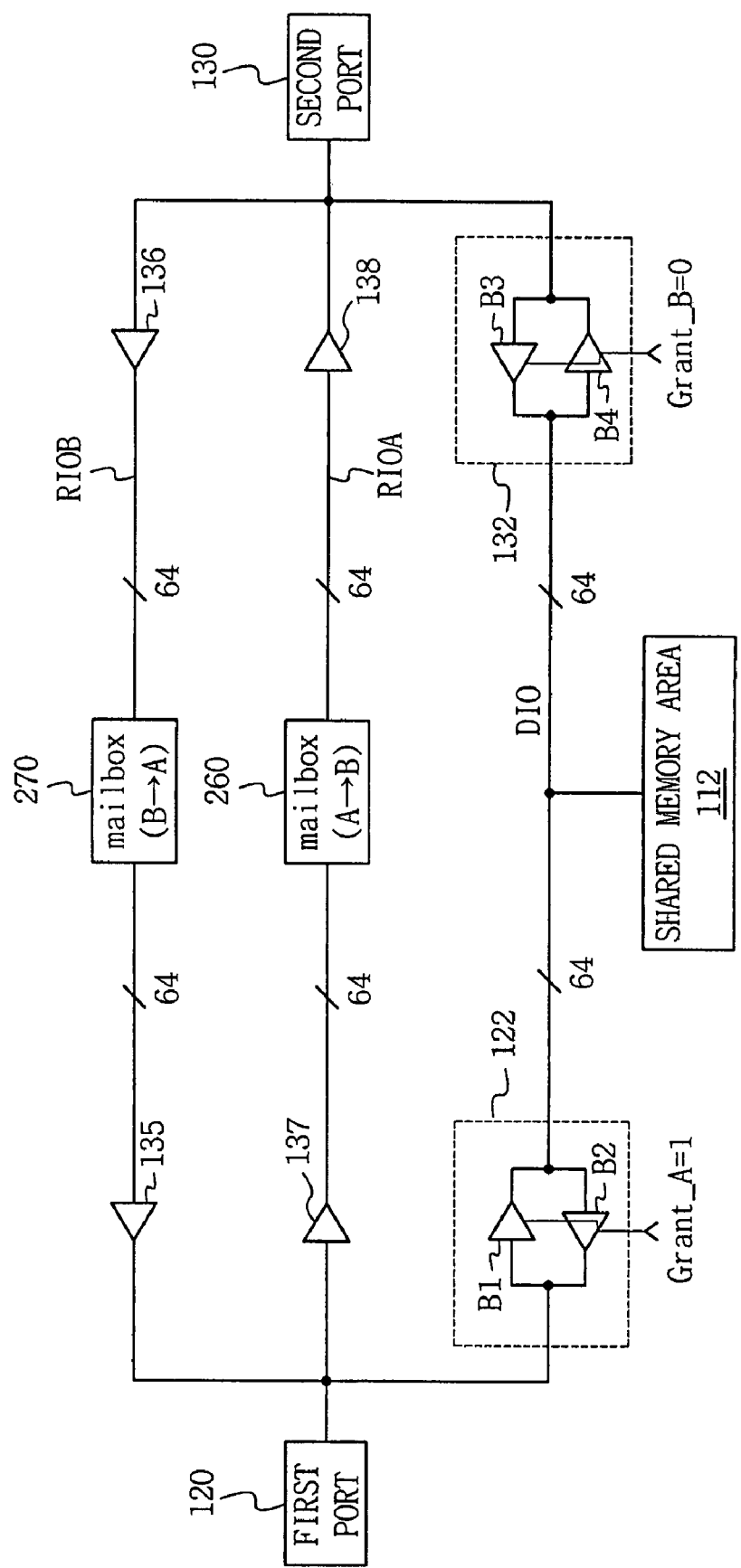
FIG. 13 illustrates a configuration of mailbox provided when a message access path for an access to a mailbox of FIG. 6 is adapted by using message input/output lines separate from the data access path.

FIG. 13 illustrates a mailbox configured by adapting a message access path for an access to a mailbox of FIG. 6 through use of a message input/output line RIOA, RIOB specifically adapted from the data access path.

As illustrated in FIG. 13, in an embodiment of the present general inventive concept, the first mailboxes 260 are register areas writable through the first port 120 and only readable through the second port 130. Thus an access path RIOB may be formed in the direction of from the first port 120 to the second port 130. The second mailboxes 270 are areas of registers that are available to write in the second port 130 and only read in the first port 120. That is, a message access path RIOA may be formed in the direction of from the second port 130 to the first port 120.

In another embodiment, the first mailboxes 260 may be readable through the first port 120 and the second mailboxes 270 may be readable through the second port 130.

The message input/output line RIOA and RIOB may be specifically adapted corresponding to the number of the mailboxes. For example, in respectively employing thirty-two first mailboxes 260 and second mailboxes 270, each 32 message input/output lines, that is, 64 message input/output lines, may be adapted. Further, a plurality of the data input/output lines DIO are adapted herein, and may be adapted with 32 lines or 64 lines, etc. though it may be different according to a type of semiconductor memory devices.

The shared memory area 112 is accessible through the first port 120 or the second port 130 according to which port has an access right Grant.

Drivers B1, B2, B3 and B4 as illustrated in FIG. 13 constitute access right controllers 122 and 132 for the shared memory area 112 described above with reference to FIG. 7, and rest drivers 135, 136, 137 and 138 control a direction of a message access path.

In FIG. 13, if a capacity of the mailbox area becomes large so that relatively more mailboxes are adapted, a problem of requiring relatively more message input/output lines may be caused. A solution to the problem is presented as follows, referring to FIGS. 14 and 15.

Figure 14:
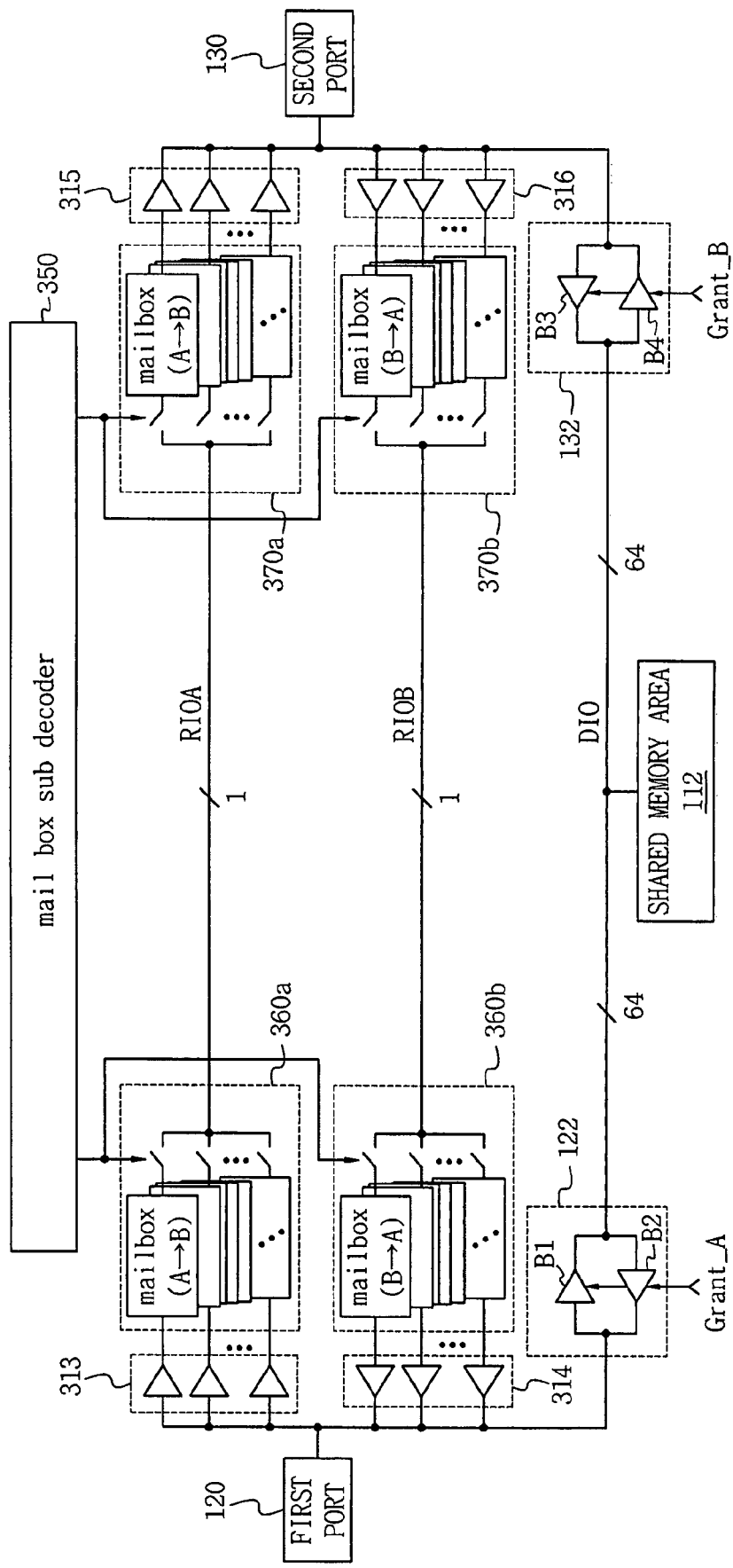
FIGS. 14 and 15 illustrate a configuration of a mailbox adapted by using each one message input/output line per port.
Figure 15:
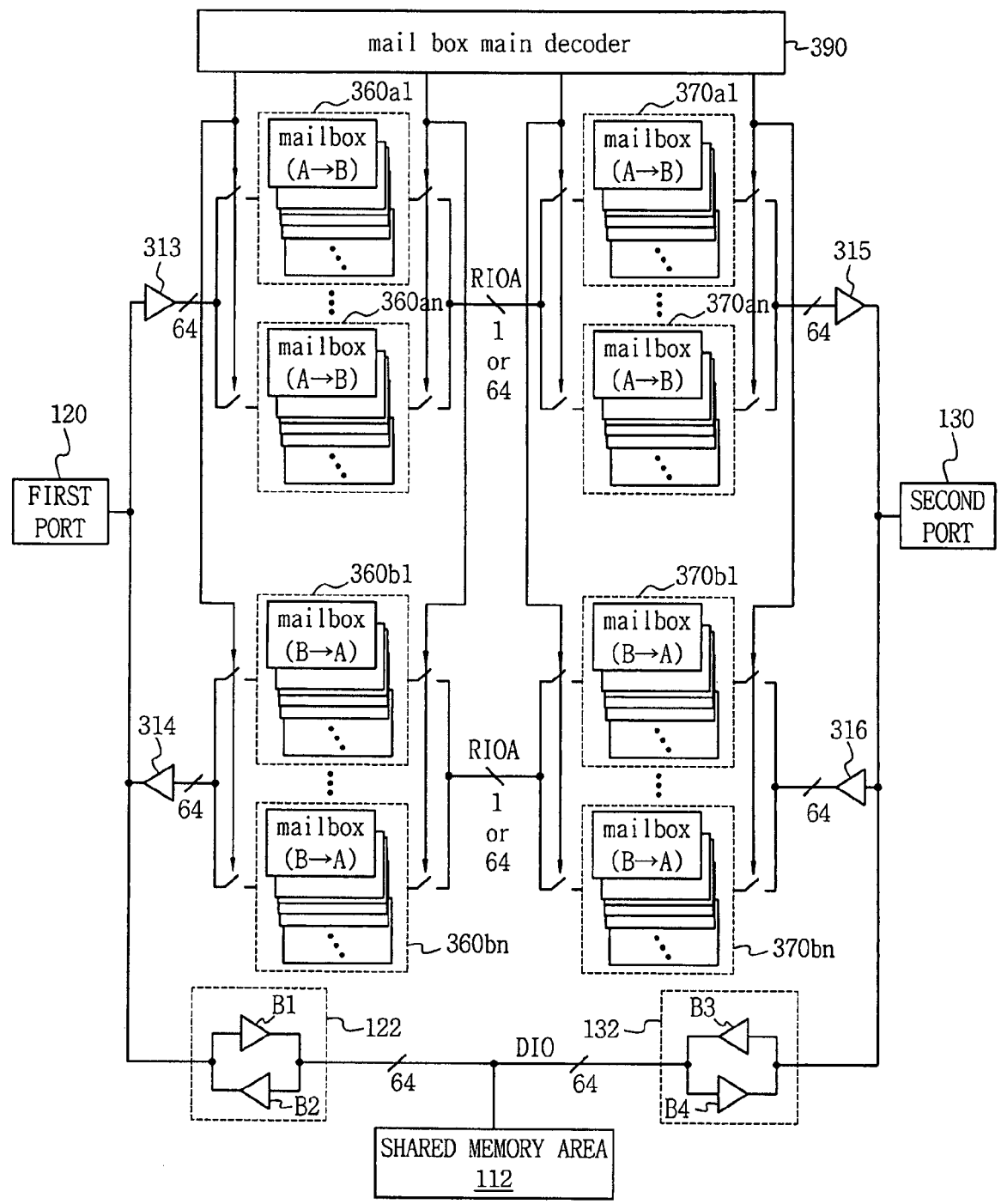

FIGS. 14 and 15 provide examples of a mailbox as illustrated in FIG. 6 having a large capacity of a mailbox area, in which a message access path for the first port and a message access path for the second port are adapted, each using one message input/output line RIOA and RIOB adapted specifically from data input/output line.

As illustrated in FIG. 14, two first mailbox blocks 360a and 370a are connected to each other, interposing one first common message input/output line RIOA therebetween, and two second mailbox blocks 360b and 370b are connected to each other, interposing one second common message input/output line RIOB.

The first mailbox blocks 360a and 370a may be classified as a first local mailbox block 370a including a plurality of first local mailboxes accessible passing through the first common message input/output line RIOA in the first port 120, and a first main mailbox block 360a including a plurality of first main mailboxes accessible without passing through the first common message input/output lien RIOA in the first port 120. The second mailbox blocks 360b and 370b may be classified as a second local mailbox block 360b including second local mailboxes accessible passing through the second common message input/output line RIOB in the second port 130, and a second main mailbox block 370b including second main mailboxes accessible without passing through the second common message input/output line RIOB in the second port 130.

The first main mailboxes of the first main mailbox block 360a, and the second local mailboxes of the second local mailbox block 360b, are connected to the first port 120 through specific lines each corresponding to the number of the first main mailboxes and the second local mailboxes. The first local mailboxes of the first local mailbox block 370a, and the second main mailboxes of the second main mailbox block 370b, are connected to the second port 130 through specific lines each corresponding to the number of the first main mailboxes and the second local mailboxes. For example, when 32 or 64 first main mailboxes are adapted, they may be connected to each other through 32 or 64 specific lines.

Further, a mailbox sub decoder 350 may be adapted. The mailbox sub decoder 350 may be used so that any one of a first local mailbox of the first local mailbox block 370a and any one of a first main mailbox of the first main mailbox block 360a are selectively coupled to the first common message input/output line RIOA. The mailbox sub decoder 350 may also be used so that any one of a second local mailbox of the second local mailbox block 360b and any one of a second main mailbox of the second main mailbox block 370b are selectively coupled to the second common message input/output line RIOB.

In the application to mailbox areas 260 and 270 of FIG. 6, the first main mailbox block 360a and the second local mailbox block 360b may be disposed in mailbox area 260, and the first local mailbox block 370a and the second main mailbox block 370b may be disposed in mailbox area 270.

The shared memory area 112 is accessible through the first port 120 or the second port 130 according to which port has an access right Grant.

Drivers B1, B2, B3 and B4 as illustrated in the drawing constitute access right controllers 122 and 132 relating to the shared memory area 112 described above with reference to FIG. 7, and rest drivers 313, 314, 315 and 316 are provided to control the direction of the message access path. Drivers to control a message access path may be provided as many as either mailboxes or mailbox blocks.

Write and read operation of a message through the first port 120 is described as follows. The write and read operation of a message is performed regardless of an access right Grant to the shared memory area 112.

First, a message to be transferred to the second port 130 is written to the first main mailboxes of the first main mailbox block 360a through the first port 120. As the first main mailboxes of the first main mailbox block 360a are independently coupled to the first port through specific lines, a simultaneous write through one clock can be performed.

Then, the mailbox sub decoder 350 operates, selectively or sequentially connecting the first main mailboxes and the first local mailboxes with the first common message input/output lines RIOA. Subsequently, messages written to the first main mailboxes through the first port 120 are serially transmitted through the first common message input/output line RIOA and each written to the first local mailboxes of the first local mailbox block 370a. Then, messages stored in the first main mailbox block 360a and messages stored in the first local mailbox block 370a are kept equal.

After a write operation to the first main mailboxes through the first port 120, an interrupt signal described above with reference to FIG. 4 is generated within the semiconductor memory device so as to inform the second port 130 that the message was stored in the first mailboxes. A message write to the first local mailbox block 370a will be able to be completely performed within a period of time during which the interrupt signal is generated and transmitted to a second processor through the second port 130.

A message read through the first port 120 is performed by reading a message stored in the second local mailbox block 360b without passing through the first common message input/output line RIOA.

Next, a write and read operation of a message through the second port 130 is described as follows. The write and read operation of a message is performed regardless of an access right Grant to the shared memory area 112.

First, messages to be transferred to the first port 120 are written to the second main mailboxes of the second main mailbox block 370a through the second port 130. As the second main mailboxes of the second main mailbox block 370a are independently coupled to the second port 130 through specific lines, a simultaneous write through one clock signal can be performed.

Then, the mailbox sub decoder 350 operates, selectively or sequentially connecting the second main mailboxes of the second main mailbox block 360b and the second local mailboxes of the second local mailbox block 370b to the second common message input/output line RIOB. Subsequently, messages written to the second main mailboxes through the second port 130 are serially transmitted through the second common message input/output line RIOB and written to the second local mailboxes. Accordingly, messages stored in the second main mailbox block 370b and messages stored in the second local mailbox block 360b are kept equal.

After the write operation to the second main mailboxes through the second port 130, an interrupt signal described above with reference to FIG. 4 is generated within the semiconductor memory device so as to inform the first port 120 that the message was stored in the second main mailboxes. A message write to the second local mailbox block 360b will be able to be sufficiently performed within a period of time during which the interrupt signal is generated and transmitted to a first processor through the first port 120.

A message read through the second port 130 is performed by reading a message stored in the first local mailbox block 370a without passing through the second common message input/output line RIOB.

Referring to FIG. 15, there are illustrated a plurality of first local mailbox blocks 370a1~370an, a plurality of first main mailbox blocks 360a1~360an, a plurality of second local mailbox blocks 360b1~360bn, and a plurality of second main mailbox blocks 370b1~370bn. FIG. 15 illustrates an operation example in which a respectively plural numbers of mailbox blocks 360a, 360b, 370a and 370b illustrated in FIG. 14 are adapted.

The first main mailbox blocks 360a1~360an are connected to the first local mailbox blocks 370a1~370an through one first common message input/output line RIOA. The second main mailbox blocks 370b1~370bn are connected to the second local mailbox blocks 360b1~360bn through one second common message input/output line RIOB interposed therebetween.

Then a mailbox main decoder 390, which selects any one of the first main mailbox blocks 360a1~360an and selects any one of the first local mailbox blocks 370a1~370an, can be adapted additionally.

The mailbox main decoder 390 also implements a selection operation of selecting any one of the second main mailbox blocks 370b1~370bn and selecting any one of the second local mailbox blocks 360b1~360bn.

In the application thereof to FIG. 6, the first main mailbox blocks 360a1~360an and the second local mailbox blocks 360b1~360bn may be disposed in a mailbox area 260, and in a mailbox area 270, the first local mailbox blocks 370a1~370an and the second main mailbox blocks 370b1~370bn may be disposed.

The shared memory area 112 is accessible through the first port 120 or the second port 130 according to which port has an access right Grant.

In the drawing, drivers B1, B2, B3 and B4 constitute access right controllers 122 and 132 for the shared memory area 112 described with reference to FIG. 7, and rest drivers 313, 314, 315 and 316 are employed to control a message access path.

In a write operation through the first port 120, one first main mailbox block and one first local mailbox block among the first main mailbox bocks 360a1~360an and the first local mailbox blocks 370a1~370an are selected through the mailbox main decoder 390. Its next write operation is performed as illustrated in FIG. 14. In the first main mailbox blocks 360a1~360an and the first local mailbox blocks 370a1~370an, selection operations of mailbox blocks may be performed simultaneously or performed with a time difference. For example, a selection operation of any one of the first main mailbox blocks 360a1~360an and a selection operation of any one of the first local mailbox blocks 370a1~370a may be performed at the same time, or any one of the first local mailbox blocks may be selected after a lapse of predetermined time from the time when any one of the first main mailbox blocks is selected. Accordingly, the first local mailbox block may be selected after a completion of a write operation to the first main mailbox block.

A write operation to the first main mailbox blocks 360a1~360an is performed by repeating an operation of selecting a first mailbox block, an operation of writing When any one of the first main mailbox blocks 360a1~360an is selected through the mailbox main decoder 390 and a message write operation thereto is completed, a write operation to the first main mailbox blocks 360a1~360an is performed as the method of continuously selecting other first main mailbox blocks. In addition, while a write operation on a first main mailbox block is being performed, a message stored in another first main mailbox block on which a write operation has been already performed may be written in a corresponding first local mailbox block.

In a write operation through the second port 130, one second main mailbox block and one second local mailbox block among the second main mailbox bocks 370b1~370bn and the second local mailbox blocks 360b1~360bn are selected through the mailbox main decoder 390. Its next operation is the same as that in FIG. 14.

For example, a selection operation of any one of the second main mailbox blocks 370b1~370bn and a selection operation of any one of the second local mailbox blocks 360b1~360bn may be performed at the same time, or any one of the second local mailbox blocks may be selected after a lapse of predetermined time from the time when any one of the second main mailbox blocks is selected. That is, the second local mailbox block may be selected after a completion of a write operation to the second main mailbox block.

When any one of the second main mailbox blocks 370b1~370bn is selected through the mailbox main decoder 390 and a message write operation thereto is completed, a write operation to the second main mailbox blocks 370b1~370bn is performed as the method of continuously selecting other second main mailbox blocks. In addition, while a write operation on a second main mailbox block is being performed, a message stored in another second main mailbox block on which a write operation has been already performed may be written in a corresponding second local mailbox block.

As described above with reference to FIG. 15, one of a plurality of mailbox blocks is selected by the mailbox main decoder 390 and a plurality of mailboxes of the selected mailbox block are connected to one common message input/output line RIOA or RIOB by the mailbox sub decoder 350.

Therefore, even though a large capacity of mailbox area is required, an access operation is available without additional lines.

There may be provided another example in which the first main mailbox blocks 360a1~360an are coupled with the first local mailbox blocks 370a1~370an through a plurality of message input/output lines RIOA. For example, first message input/output lines RIOA, i.e., 32 or 62 lines, corresponding to the number of first main mailboxes of any one of the first main mailbox blocks 360a1~360an, may be adapted being connected with first local mailboxes of any one of the first local mailbox blocks 370a1~370an. Likewise, the second main mailbox blocks 370b1~370bn and the second local mailbox blocks 360b1~360bn may have a configuration to be connected with a plurality of second message input/output lines RIOB. Accordingly, the mailbox sub decoder described with reference to FIG. 14 is not needed, and a message access path can be formed only with a selection of mailbox block through the mailbox main decoder 390. And write operation to mailboxes can be performed by a parallel transmission using respective message input/output lines, instead of a serial transmission illustrated in FIG. 14.

The present general inventive concept can also be embodied as computer-readable codes on a computer-readable medium. The computer-readable medium can include a computer-readable recording medium and a computer-readable transmission medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

As described above, according to various embodiments of the present general inventive concept, a data input/output path can be shared, or a message transmission can be performed through a specific message input/output line. Additionally, the number of message input/output lines can be substantially reduced, thus lessening the increased chip size. Also the present general inventive concept may be adequately applied to a memory device having a large capacity of a mailbox area.

It will be apparent to those skilled in the art that modifications and variations can be made in the present general inventive concept without deviating from the spirit or scope of the present general inventive concept. Thus, it is intended that the present general inventive concept cover any such modifications and variations of this present general invention concept provided they come within the scope of the appended claims and their equivalents. For example, a configuration of a register inside a memory or a circuit configuration and access method may be changed diversely.

For example, furthermore, in four memory areas, one may be designated as a shared memory area and rest three may be designated as private memory areas, or all four memory areas may be determined as a shared memory area. Although the system employing two processors was described above as the example, three or more processors may be employed to a system, in which three or more ports are installed in one DRAM and one of three processors accesses to a predetermined shared memory at a specific time. In addition, though DRAM was described as the example, a technical spirit of the present general inventive concept can be extendedly applied to a static random access memory or nonvolatile memory etc. without limiting to the above-described one.

Accordingly, these and other changes and modifications are seen to be within the true spirit and scope of the present general inventive concept as defined by the appended claims.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A semiconductor memory device having N number of ports, the device comprising:
   at least one shared memory area provided in a memory cell array, operationally connected to the N number of ports, and accessible through a plurality of data input/output lines to form a data access path between the at least one shared memory area and one port, having an access right to the at least one shared memory area, among the N number of ports; and
   N number of mailbox areas adjacent to the at least one shared memory for message communication provided in one-to-one correspondence with the N number of ports and accessible through the plurality of data input/output lines when an address of a predetermined area of the at least one shared memory area is applied to the semiconductor memory device.

2. The device of claim 1, wherein N is two, one of the two ports is a first port, and the other of the two ports is a second port.

3. The device of claim 2, wherein each of the two mailbox areas comprises:
   at least one first mailbox that is writable and readable through the first port and that is not writable but readable through the second port: and
   at least one second mail box that is writable and readable through the second port and that is not writable but readable through the first port.

4. The device of claim 3, further comprising:
   a mailbox path controller to set at least one message access path to the two mailbox areas through the first and second ports.

5. The device of claim 4, wherein the two mailbox areas are disposed on both sides of the at least one shared memory area, and the data input/output lines are disposed in parallel over the at least one shared memory area to form a shared path serving as a data access path or a message access path.

6. The device of claim 5, wherein the at least two first mailboxes are classified into at least one first local mailbox capable of being connected to the first port through the shared path and at least one first main mailbox capable of being directly connected to the first port without using the shared path; and the at least two second mailboxes are classified into at least one second local mailbox capable of being connected to the second port through the shared path and at least one second main mailbox capable of being directly connected to the second port without using the shared path.

7. The device of claim 6, when the first port has an access right to the at least one shared memory area,
a message writing operation is performed on all of the at least one first main mailbox and the at least one first local mailbox through the first port and is performed on the at least one second main mailbox through the second port, and
a message reading operation is performed on the at least one second main mailbox through the first port and is performed on the at least one first local mailbox through the second port.

8. The device of claim 7, wherein, when the second port has an access right to the at least one shared memory area,
a message writing operation is performed on the at least one first main mailbox through the first port and is performed on the at least one second main mailbox and the at least one second local mailbox through the second port, and
a message reading operation is performed on the at least one second local mailbox through the first port and is performed on the at least one first main mailbox through the second port.

9. The device of claim 8, wherein, during the message reading operation is performed on the at least one second main mailbox through the first port, an operation of updating messages of the at least one second local mailbox with messages of the at least one second main mailbox is performed, and during the message reading operation on the at least one first main mailbox is performed through the second port, an operation of updating messages of the at least one first local mailbox with messages of the at least one first main mailbox is performed.

10. A semiconductor memory device having N number of ports, comprising:
at least one shared memory area provided in a memory cell array, operationally connected to the N number of ports, and accessible through a plurality of data input/output lines to form a data access path between the at least one shared memory area and one port, having an access right to the at least one shared memory area, among the N number of ports; and
N number of mailbox areas adjacent to the at least one shared memory and accessible through a plurality of message input/output lines, which are provided per port for message communication between the N number of ports, are separately disposed in parallel to the plurality of data input/output lines, and serve as a message access path, when an address of a predetermined area of the at least one shared memory area is applied to the semiconductor memory device.

11. The device of claim 10, wherein the plurality of message input/output lines are disposed over the at least one shared memory area.

12. The device of claim 11, wherein N is two, one of the two ports is a first port, and the other of the two ports is a second port.

13. The device of claim 12, wherein each of the two mailbox areas comprises:
at least one first mailbox that is writable and readable through the first port and that is not writable but readable through the second port; and
at least one second mailbox that is writable and readable through the second port and that is not writable but readable through the first port.

14. The device of claim 13, wherein the number of message input/output lines is equal to the number of mailboxes.

15. The device of claim 13, wherein the at least two first mailboxes include at least one first local mailbox and at least one first main mailbox, the at least one local mailbox forming a first local mailbox block which is capable of being connected to the first port through a first common message input/output line, and the at least one main mailbox forming a first main mailbox block which is capable of being directly connected to the first port without using the first common message input/output line, and
the at least two second mailboxes include at least one second local mailbox and at least one second main mailbox, the at least one second local mailbox forming a second local mailbox block which is capable of being connected to the second port through a second common message input/output line, and the at least one second main mailbox forming a second main mailbox block which is capable of being directly connected to the second port without using the second common message input/output line.

16. The device of claim 15, further comprising:
a mailbox sub-decoder to selectively connect any one of the at least one first local mailbox of the first local mailbox block and any one of the at least one first main mailbox of the first main mailbox block through the first common message input/output line, or selectively connect any one of the at least one second local mailbox of the second local mailbox block and any one of the at least one second main mailbox of the second main mailbox block through the second common message input/output line.

17. The device of claim 16, wherein the at least one first main mailbox and the at least one second local mailbox are coupled to the first port through separate lines, and the at least one first local mailbox and the at least one second main mailbox are coupled to the second port through separate lines.

18. The device of claim 17, wherein messages written to the at least one first main mailbox through the first port are serially transmitted through the first common message input/output line and are written to the at least one first local mailbox, and messages written to the at least one second main mailbox through the second port are serially transmitted through the second common message input/output line and are written to the at least one second local mailbox.

19. The device of claim 18, wherein a message reading operation on any one of the at least two first mailboxes through the second port is performed by accessing to a corresponding first local mailbox, and a message reading operation on any one of the at least two second mailboxes through the first port is performed by accessing to a corresponding second local mailbox.

20. The device of claim 19, wherein the semiconductor memory device comprises:
a plurality of the first local mailbox blocks;
a plurality of the first main mailbox blocks;
a plurality of the second local mailbox blocks; and
a plurality of the second main mailbox blocks.

21. The device of claim 20, further comprising:
a mailbox main decoder to select any one of the first mailbox blocks and any one of the second mailbox blocks so that a mailbox area is accessed through the first or second port.

22. The device of claim 13, wherein the semiconductor memory device comprises:
a plurality of first mailbox blocks each having at least one first mailbox; and
a plurality of second mailbox blocks each having at least one second mailbox.

23. The device of claim 22, wherein the plurality of first mailbox blocks are classified into first local mailbox blocks and first main mailbox blocks, the first local mailbox blocks each including at least one first local mailbox capable of being connected to the first port through at least one first message input/output line provided in one-to-one correspondence with the at least one first local mailbox, and the first main mailbox blocks each including at least one first main mailbox capable of being directly connected to the first port without using the at least one first message input/output line, and
the plurality of second mailbox blocks are classified into second local mailbox blocks and second main mailbox blocks, the second local mailbox blocks each including at least one second local mailbox capable of being connected to the second port through at least one second message input/output line provided in one-to-one correspondence with the at least one second local mailbox, and the second main mailbox blocks each including at least one second main mailbox capable of being directly connected to the second port without using the at least one second message input/output line.

24. The device of claim 23, further comprising:
a mailbox main decoder to select any one of the plurality of first mailbox blocks and any one of the plurality of second mailbox blocks.

25. A method of controlling an access to a mailbox in a semiconductor memory device having a shared memory area accessed through at least two ports and a mailbox area accessed when an address of a predetermined area of the shared memory area is applied to the semiconductor memory device, and adapted to perform a message communication between the at least two ports, the method comprising:
preparing pairs of main and local mailbox blocks as many as the number of ports, each pair of main and local mailbox blocks corresponding to one of the at least two ports, each local mailbox block including a plurality of local mailboxes that each are capable of being connected to a corresponding port through a data access path serving as a shared path for the shared memory area, and each main mailbox block including a plurality of main mailboxes that each are capable of being directly connected to a corresponding port without using the shared path; and
performing a control so that when a predetermined port of the at least two ports has an access right to the shared memory area, a message writing operation on all of main mailboxes and local mailboxes corresponding to the predetermined port and a message reading operation on some main mailboxes, having messages to the predetermined port, among the main mailboxes corresponding to the other ports are performed through the predetermined port, and so that when the predetermined port does not have the access right to the shared memory area, a message writing operation on the main mailboxes corresponding to the predetermined port and a message reading operation on some local mailboxes, having messages to the predetermined port, among the local mailboxes corresponding to the other ports are performed through the predetermined port.

26. The method of claim 25, wherein, while the message reading operation on the some main mailboxes is being performed through the predetermined port, an update operation is performed so that messages in the some main mailboxes are the same as messages of corresponding local mailboxes.

27. A method of controlling an access to a mailbox in a semiconductor memory device having a shared memory area accessed through at least two ports and a mailbox area accessed when an address of a predetermined area of the shared memory area is applied to the semiconductor memory device, and adapted to perform a message communication between the at least two ports, the method comprising:
preparing pair of main and local mailbox blocks as many as the number of ports, each pair of main and local mailbox blocks corresponding to one of the at least two ports, each local mailbox block including a plurality of local mailboxes that are accessible through a common message input/output line separate from data input/output lines for a data access to the shared memory area, and each main mailbox block including a plurality main mailboxes that are accessible through a corresponding port without using the common message input/output line; and
performing a control so that a message writing operation through a predetermined port of the at least two ports is performed on only at least one mailbox corresponding to the predetermined port and the written messages are serially transmitted through the common message input/output line and written to the at least one local mailbox corresponding to the predetermined port, and a message reading operation through the predetermined port is performed on some local mailboxes, having messages to the predetermined port, among the local mailboxes corresponding to the other ports.

28. A semiconductor memory device, comprising:
a first local mailbox block having a plurality of local mailboxes;
a first main mailbox block having a plurality of first main mailboxes;
a first common message input/output line interposed between the first local mailbox block and the first main mailbox block; and
a mailbox sub decoder to selectively couple any one of the plurality of first local mailboxes and any one of the plurality of first main mailboxes to the first common message input/output line.

29. The semiconductor memory device of claim 28, further comprising:
a second local mailbox block having a plurality of second local mailboxes;
a second main mailbox block having a plurality of second main mailboxes;
a second common message input/output line interposed between the second local mailbox block and the second main mailbox block;
wherein the mailbox sub decoder selectively couples any one of the plurality of the second local mailboxes and any one of the plurality of the second main mailboxes to the second common message input/output line.

30. A computer-readable recording medium having embodied thereon a computer program to execute a method of controlling an access to a plurality of mailboxes in a semiconductor memory device having a shared memory area accessed through a plurality of ports and a mailbox area accessed when an address of a predetermined area of the shared memory area is applied to the semiconductor memory device and adapted to perform a message communication between the plurality of ports, wherein the method comprises:

preparing pairs of main and local mailboxes provided in one-to-one correspondence with the plurality of ports, each local mailbox block including a plurality of local mailboxes that are accessible through a data access path for the shared memory area serving as a shared path, and each main mailbox block including a plurality of main mailboxes that are accessible without using the shared path; and performing a control so that a predetermined port of the plurality of ports has an access right to the shared memory area, a message writing operation on all of main and local mailboxes corresponding to the predetermined port is performed and a message reading operation on some main mailboxes, having messages to the predetermined port, among the main mailboxes corresponding to the other ports is performed, and so that when the predetermined port does not have the access right to the shared memory area, a message writing operation on the main mailboxes corresponding to the predetermined port and a message reading operation on some local mailboxes, having messages to the predetermined ports, among the local mailboxes corresponding to the other ports are performed.

* * * * *